United States Patent
Wang et al.

(10) Patent No.: US 7,678,245 B2
(45) Date of Patent: Mar. 16, 2010

(54) METHOD AND APPARATUS FOR ELECTROCHEMICAL MECHANICAL PROCESSING

(75) Inventors: Yan Wang, Sunnyvale, CA (US); Siew Neo, Santa Clara, CA (US); Feng Liu, San Jose, CA (US); Stan D. Tsai, Fremont, CA (US); Yongqi Hu, San Jose, CA (US); Alain Duboust, Sunnyvale, CA (US); Antoine Manens, Palo Alto, CA (US); Ralph M. Wadensweiler, Sunnyvale, CA (US); Rashid Mavliev, Santa Clara, CA (US); Liang-Yuh Chen, Foster City, CA (US); Donald J. K. Olgado, Palo Alto, CA (US); Paul D. Butterfield, San Jose, CA (US); Ming-Kuei Tseng, San Jose, CA (US); Shou-Sung Chang, Stanford, CA (US); Lizhong Sun, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1659 days.

(21) Appl. No.: 10/880,752

(22) Filed: Jun. 30, 2004

(65) Prior Publication Data

US 2005/0000801 A1    Jan. 6, 2005

Related U.S. Application Data

(63) Continuation-in-part of application No. 10/608,513, filed on Jun. 26, 2003, now Pat. No. 7,374,644, (Continued)

(60) Provisional application No. 60/484,189, filed on Jul. 1, 2003, provisional application No. 60/516,680, filed on Nov. 3, 2003.

(51) Int. Cl.
*C25B 9/00* (2006.01)

(52) U.S. Cl. .......... 204/267; 204/194; 204/242
(58) Field of Classification Search .......... 204/267, 204/194, 242
See application file for complete search history.

(56) References Cited

U.S. PATENT DOCUMENTS 1,601,642 A    9/1926    Parker (Continued)

FOREIGN PATENT DOCUMENTS

EP    0 325 753    8/1989

(Continued)

OTHER PUBLICATIONS

Alexander, Jr., "Electrically Conductive Polymer Nanocomposite Materials", http://www.afrlhorizons.com/Briefs/Sept02/ML0206.html printed Feb. 19, 2003.

(Continued)

*Primary Examiner*—Harry D Wilkins, III
*Assistant Examiner*—Zulmariam Mendez
(74) *Attorney, Agent, or Firm*—Patterson & Sheridan

(57) ABSTRACT

Embodiments of the invention generally provide a method and apparatus for processing a substrate in an electrochemical mechanical planarizing system. In one embodiment, a cell for polishing a substrate includes a processing pad disposed on a top surface of a platen assembly. A plurality of conductive elements are arranged in a spaced-apart relation across the upper planarizing surface and adapted to bias the substrate relative to an electrode disposed between the pad and the platen assembly. A plurality of passages are formed through the platen assembly between the top surface and a plenum defined within the platen assembly. In another embodiment, a system is provided having a bulk processing cell and a residual processing cell. The residual processing cell includes a biased conductive planarizing surface. In further embodiments, the conductive element is protected from attack by process chemistries.

26 Claims, 11 Drawing Sheets

Related U.S. Application Data which is a continuation-in-part of application No. 10/140,010, filed on May 7, 2002, now Pat. No. 6,979,248, and a continuation-in-part of application No. 10/211,626, filed on Aug. 2, 2002, now Pat. No. 7,125,477, which is a continuation-in-part of application No. 10/033,732, filed on Dec. 27, 2001, now Pat. No. 7,066,800, which is a continuation-in-part of application No. 09/505,899, filed on Feb. 17, 2000, now Pat. No. 6,537,144, said application No. 10/608,513 is a continuation-in-part of application No. 10/210,972, filed on Aug. 2, 2002, now Pat. No. 7,303,662, which is a continuation-in-part of application No. 09/505,899, said application No. 10/608,513 is a continuation-in-part of application No. 10/151,538, filed on May 16, 2002, now abandoned, application No. 10/880,752, which is a continuation-in-part of application No. 10/244,697, filed on Sep. 16, 2002, now Pat. No. 6,991,526, which is a continuation-in-part of application No. 10/244,688, filed on Sep. 16, 2002, now Pat. No. 6,848,970.

(56) References Cited

U.S. PATENT DOCUMENTS

| | | |
|---|---|---|
| 1,927,162 A | 9/1933 | Fiedler et al. |
| 2,112,691 A | 3/1938 | Crowder |
| 2,240,265 A | 4/1941 | Nachtman |
| 2,392,687 A | 1/1946 | Nachtman |
| 2,431,065 A | 11/1947 | Miller |
| 2,451,341 A | 10/1948 | Jernstedt |
| 2,453,481 A | 11/1948 | Wilson |
| 2,454,935 A | 11/1948 | Miller |
| 2,456,185 A | 12/1948 | Grube |
| 2,457,510 A | 12/1948 | van Omum |
| 2,458,676 A | 1/1949 | Brenner et al. |
| 2,461,556 A | 2/1949 | Lorig |
| 2,473,290 A | 6/1949 | Millard |
| 2,477,808 A | 8/1949 | Jones |
| 2,479,323 A | 8/1949 | Davis |
| 2,480,022 A | 8/1949 | Hogaboom |
| 2,490,055 A | 12/1949 | Hoff |
| 2,495,695 A | 1/1950 | Camin et al. |
| 2,500,205 A | 3/1950 | Schaefer |
| 2,500,206 A | 3/1950 | Schaefer et al. |
| 2,503,863 A | 4/1950 | Bart |
| 2,506,794 A | 5/1950 | Kennedy et al. |
| 2,509,304 A | 5/1950 | Klein |
| 2,512,328 A | 6/1950 | Hays |
| 2,517,907 A | 8/1950 | Mikulas |
| 2,519,945 A | 8/1950 | Twele et al. |
| 2,530,677 A | 11/1950 | Berkenkotter et al. |
| 2,535,966 A | 12/1950 | Teplitz |
| 2,536,912 A | 1/1951 | Cobertt |
| 2,539,898 A | 1/1951 | Davis |
| 2,540,175 A | 2/1951 | Rosenqvist |
| 2,544,510 A | 3/1951 | Prahl |
| 2,549,678 A | 4/1951 | Fiandt |
| 2,544,943 A | 5/1951 | Farmer |
| 2,556,017 A | 6/1951 | Vonada |
| 2,560,534 A | 7/1951 | Adler |
| 2,560,966 A | 7/1951 | Lee |
| 2,569,577 A | 10/1951 | Reading |
| 2,569,578 A | 10/1951 | Rieger |
| 2,571,709 A | 10/1951 | Gray |
| 2,576,074 A | 11/1951 | Nachtman |
| 2,587,630 A | 3/1952 | Konrad et al. |
| 2,619,454 A | 11/1952 | Zapponi |
| 2,633,452 A | 3/1953 | Hogaboom, Jr. et al. |
| 2,646,398 A | 7/1953 | Henderson |
| 2,656,283 A | 10/1953 | Fink et al. |
| 2,656,284 A | 10/1953 | Toulmin |
| 2,657,177 A | 10/1953 | Rendel |
| 2,657,457 A | 11/1953 | Toulmin |
| 2,673,836 A | 3/1954 | Vonada |
| 2,674,550 A | 4/1954 | Dunlevy et al. |
| 2,675,348 A | 4/1954 | Greenspan |
| 2,680,710 A | 6/1954 | Kenmore et al. |
| 2,684,939 A | 7/1954 | Geese |
| 2,696,859 A | 8/1954 | Gray et al. |
| 2,689,215 A | 9/1954 | Bart |
| 2,695,269 A | 11/1954 | de Witz et al. |
| 2,698,832 A | 1/1955 | Swanson |
| 2,706,173 A | 4/1955 | Wells et al. |
| 2,706,175 A | 4/1955 | Licharz |
| 2,708,445 A | 5/1955 | Manson et al. |
| 2,710,834 A | 6/1955 | Vrilakas |
| 2,711,993 A | 6/1955 | Lyon |
| 3,162,588 A | 12/1964 | Bell |
| 3,334,041 A | 8/1967 | Dyer et al. |
| 3,433,730 A | 3/1969 | Kennedy et al. |
| 3,448,023 A | 6/1969 | Bell |
| 3,476,677 A | 11/1969 | Corley et al. |
| 3,607,707 A | 9/1971 | Chenevier |
| 3,873,512 A | 3/1975 | Latanision |
| 3,942,959 A | 3/1976 | Markoo et al. |
| 3,992,178 A | 11/1976 | Markoo et al. |
| 4,047,902 A | 9/1977 | Wiand |
| 4,082,638 A | 4/1978 | Jumer |
| 4,119,515 A | 10/1978 | Costakis |
| 4,125,444 A | 11/1978 | Inoue |
| 4,312,716 A | 1/1982 | Maschler et al. |
| 4,523,411 A | 6/1985 | Freerks |
| 4,704,511 A | 11/1987 | Miyano |
| 4,713,149 A | 12/1987 | Hoshino |
| 4,752,371 A | 6/1988 | Kreisel et al. |
| 4,772,361 A | 9/1988 | Dorsett et al. |
| 4,793,895 A | 12/1988 | Kaanta et al. |
| 4,839,993 A | 6/1989 | Masuko et al. |
| 4,934,102 A | 6/1990 | Leach et al. |
| 4,954,141 A | 9/1990 | Takiyama et al. |
| 4,956,056 A | 9/1990 | Zubatova et al. |
| 5,011,510 A | 4/1991 | Hayakawa et al. |
| 5,061,294 A | 10/1991 | Harmer et al. |
| 5,066,370 A | 11/1991 | Andreshak et al. |
| 5,096,550 A | 3/1992 | Mayer et al. |
| 5,108,463 A | 4/1992 | Buchanan |
| 5,136,817 A | 8/1992 | Tabata et al. |
| 5,137,542 A | 8/1992 | Buchanan et al. |
| 5,203,884 A | 4/1993 | Buchanan et al. |
| 5,217,586 A | 6/1993 | Datta et al. |
| 5,225,034 A | 7/1993 | Yu et al. |
| 5,257,478 A | 11/1993 | Hyde et al. |
| 5,328,716 A | 7/1994 | Buchanan |
| 5,478,435 A | 12/1995 | Murphy et al. |
| 5,534,106 A | 7/1996 | Cote et al. |
| 5,543,032 A | 8/1996 | Datta et al. |
| 5,560,753 A | 10/1996 | Schnabel et al. |
| 5,562,529 A | 10/1996 | Kishii et al. |
| 5,567,300 A | 10/1996 | Datta et al. |
| 5,575,706 A | 11/1996 | Tsai et al. |
| 5,578,362 A | 11/1996 | Reinhardt et al. |
| 5,624,300 A | 4/1997 | Kishii et al. |
| 5,633,068 A | 5/1997 | Ryoke et al. |
| 5,654,078 A | 8/1997 | Ferronato |
| 5,702,811 A | 12/1997 | Ho et al. |
| 5,738,574 A | 4/1998 | Tolles et al. |
| 5,804,507 A | 9/1998 | Perlov et al. |
| 5,807,165 A | 9/1998 | Uzoh et al. |
| 5,823,854 A | 10/1998 | Chen |
| 5,840,190 A | 11/1998 | Scholander et al. |

| | | | | | | |
|---|---|---|---|---|---|---|
| 5,840,629 A | 11/1998 | Carpio | | 6,475,332 B1 | 11/2002 | Boyd et al. |
| 5,846,882 A | 12/1998 | Birang | | 6,479,962 B1 | 11/2002 | Ziemkowski et al. |
| 5,871,392 A | 2/1999 | Meikle et al. | | 6,482,307 B2 | 11/2002 | Ashjaee et al. |
| 5,882,491 A | 3/1999 | Wardle | | 6,497,800 B1 | 12/2002 | Talieh et al. |
| 5,893,796 A | 4/1999 | Birang et al. | | 6,517,426 B2 | 2/2003 | Lee |
| 5,911,619 A | 6/1999 | Uzoh et al. | | 6,520,843 B1 | 2/2003 | Halley |
| 5,938,801 A | 8/1999 | Robinson | | 6,537,140 B1 | 3/2003 | Miller et al. |
| 5,948,697 A | 9/1999 | Hata | | 6,537,144 B1 | 3/2003 | Tsai et al. |
| 5,985,093 A | 11/1999 | Chen | | 6,551,179 B1 | 4/2003 | Halley |
| 6,001,008 A | 12/1999 | Fujimori et al. | | 6,561,873 B2 | 5/2003 | Tsai et al. |
| 6,004,880 A | 12/1999 | Liu et al. | | 6,561,889 B1 | 5/2003 | Xu et al. |
| 6,017,265 A | 1/2000 | Cook et al. | | 6,569,004 B1 | 5/2003 | Pham |
| 6,020,264 A | 2/2000 | Lustig et al. | | 6,572,463 B1 | 6/2003 | Xu et al. |
| 6,024,630 A | 2/2000 | Shendon et al. | | 6,585,579 B2 | 7/2003 | Jensen et al. |
| 6,033,293 A | 3/2000 | Crevasse et al. | | 6,630,059 B1 | 10/2003 | Uzoh et al. |
| 6,056,851 A | 5/2000 | Hsieh et al. | | 6,641,471 B1 | 11/2003 | Pinheiro et al. |
| 6,066,030 A | 5/2000 | Uzoh | | 6,656,019 B1 | 12/2003 | Chen et al. |
| 6,074,284 A | 6/2000 | Tani et al. | | 6,666,959 B2 | 12/2003 | Uzoh et al. |
| 6,077,337 A | 6/2000 | Lee | | 6,685,548 B2 | 2/2004 | Chen et al. |
| 6,090,239 A | 7/2000 | Liu et al. | | 6,692,338 B1 | 2/2004 | Kirchner |
| 6,103,096 A | 8/2000 | Datta et al. | | 6,739,951 B2 | 5/2004 | Sun et al. |
| 6,116,998 A | 9/2000 | Damgaard et al. | | 6,752,700 B2 | 6/2004 | Duescher |
| 6,132,292 A | 10/2000 | Kubo | | 6,769,969 B1 | 8/2004 | Duescher |
| 6,135,865 A * | 10/2000 | Beardsley et al. ............ 451/285 | | 6,773,560 B2 * | 8/2004 | Pedersen et al. ......... 204/224 R |
| 6,153,043 A | 11/2000 | Edelstein et al. | | 6,776,693 B2 | 8/2004 | Duboust et al. |
| 6,156,124 A | 12/2000 | Tobin | | 6,802,955 B2 | 10/2004 | Emesh et al. |
| 6,159,079 A | 12/2000 | Zuniga et al. | | 6,848,977 B1 | 2/2005 | Cook et al. |
| 6,171,467 B1 | 1/2001 | Weihs et al. | | 6,856,761 B2 | 2/2005 | Doran |
| 6,176,992 B1 | 1/2001 | Talieh | | 6,875,091 B2 * | 4/2005 | Radman et al. ................ 451/56 |
| 6,176,998 B1 | 1/2001 | Wardle et al. | | 6,962,524 B2 | 11/2005 | Butterfield et al. |
| 6,183,354 B1 | 2/2001 | Zuniga et al. | | 2001/0005667 A1 | 6/2001 | Tolles et al. |
| 6,190,494 B1 | 2/2001 | Dow | | 2001/0024878 A1 | 9/2001 | Nakamura |
| 6,210,257 B1 | 4/2001 | Carlson | | 2001/0027018 A1 | 10/2001 | Molnar |
| 6,234,870 B1 | 5/2001 | Uzoh et al. | | 2001/0035354 A1 | 11/2001 | Ashjaee et al. |
| 6,238,271 B1 | 5/2001 | Cesna | | 2001/0036746 A1 | 11/2001 | Sato et al. |
| 6,238,592 B1 | 5/2001 | Hardy et al. | | 2001/0040100 A1 | 11/2001 | Wang |
| 6,244,935 B1 | 6/2001 | Birang et al. | | 2001/0042690 A1 | 11/2001 | Talieh |
| 6,248,222 B1 | 6/2001 | Wang | | 2002/0008036 A1 | 1/2002 | Wang |
| 6,251,235 B1 | 6/2001 | Talieh et al. | | 2002/0011417 A1 | 1/2002 | Talieh et al. |
| 6,257,953 B1 | 7/2001 | Gitis et al. | | 2002/0020621 A1 | 2/2002 | Uzoh et al. |
| 6,258,223 B1 | 7/2001 | Cheung et al. | | 2002/0025760 A1 | 2/2002 | Lee et al. |
| 6,261,157 B1 | 7/2001 | Bajaj et al. | | 2002/0025763 A1 | 2/2002 | Lee et al. |
| 6,261,158 B1 | 7/2001 | Holland et al. | | 2002/0070126 A1 | 6/2002 | Sato et al. |
| 6,261,168 B1 | 7/2001 | Jensen et al. | | 2002/0077037 A1 | 6/2002 | Tietz |
| 6,261,958 B1 * | 7/2001 | Crevasse et al. ............ 438/692 | | 2002/0088715 A1 | 7/2002 | Talieh et al. |
| 6,261,959 B1 | 7/2001 | Travis et al. | | 2002/0102853 A1 | 8/2002 | Li et al. |
| 6,273,798 B1 | 8/2001 | Berman | | 2002/0108861 A1 | 8/2002 | Emesh et al. |
| 6,296,557 B1 | 10/2001 | Walker | | 2002/0119286 A1 | 8/2002 | Chen et al. |
| 6,297,159 B1 | 10/2001 | Paton | | 2002/0123300 A1 | 9/2002 | Jones et al. |
| 6,319,108 B1 | 11/2001 | Adefris et al. | | 2002/0127951 A1 | 9/2002 | Ishikawa et al. |
| 6,319,420 B1 | 11/2001 | Dow | | 2002/0130049 A1 | 9/2002 | Chen et al. |
| 6,322,422 B1 | 11/2001 | Satou | | 2002/0130634 A1 | 9/2002 | Ziemkowski et al. |
| 6,328,642 B1 | 12/2001 | Pant et al. | | 2002/0146963 A1 | 10/2002 | Teetzel |
| 6,328,872 B1 | 12/2001 | Talieh et al. | | 2002/0148732 A1 | 10/2002 | Emesh et al. |
| 6,331,135 B1 | 12/2001 | Sabde et al. | | 2003/0034131 A1 | 2/2003 | Park et al. |
| 6,368,184 B1 | 4/2002 | Beckage | | 2003/0040188 A1 | 2/2003 | Hsu et al. |
| 6,368,190 B1 | 4/2002 | Easter et al. | | 2003/0114087 A1 | 6/2003 | Duboust et al. |
| 6,372,001 B1 | 4/2002 | Omar et al. | | 2003/0116445 A1 | 6/2003 | Sun et al. |
| 6,381,169 B1 | 4/2002 | Bocian et al. | | 2003/0116446 A1 | 6/2003 | Duboust et al. |
| 6,383,066 B1 | 5/2002 | Chen et al. | | 2003/0209448 A1 | 11/2003 | Hu et al. |
| 6,386,956 B1 | 5/2002 | Sato et al. | | 2003/0213703 A1 | 11/2003 | Wang et al. |
| 6,391,166 B1 | 5/2002 | Wang | | 2003/0220053 A1 | 11/2003 | Manens et al. |
| 6,395,152 B1 | 5/2002 | Wang | | 2004/0020788 A1 | 2/2004 | Mavliev et al. |
| 6,402,591 B1 | 6/2002 | Thornton | | 2004/0020789 A1 | 2/2004 | Hu et al. |
| 6,402,925 B2 | 6/2002 | Talieh | | 2004/0023495 A1 | 2/2004 | Butterfield et al. |
| 6,406,363 B1 | 6/2002 | Xu et al. | | 2004/0082288 A1 | 4/2004 | Tietz et al. |
| 6,409,904 B1 | 6/2002 | Uzoh et al. | | 2004/0121708 A1 | 6/2004 | Hu et al. |
| 6,413,153 B1 | 7/2002 | Molar | | 2004/0134792 A1 | 7/2004 | Butterfield et al. |
| 6,428,394 B1 | 8/2002 | Mooring et al. | | 2004/0163946 A1 | 8/2004 | Chang et al. |
| 6,431,968 B1 | 8/2002 | Chen et al. | | 2004/0266327 A1 | 12/2004 | Chen et al. |
| 6,440,295 B1 | 8/2002 | Wang | | 2005/0092621 A1 | 5/2005 | Hu et al. |
| 6,447,668 B1 | 9/2002 | Wang | | 2005/0133363 A1 | 6/2005 | Hu et al. |
| 6,471,847 B2 | 10/2002 | Talieh et al. | | 2005/0161341 A1 | 7/2005 | Duboust et al. |

| | | | |
|---|---|---|---|
| 2005/0178666 | A1 | 8/2005 | Tsai et al. |
| 2005/0194681 | A1 | 9/2005 | Hu et al. |

FOREIGN PATENT DOCUMENTS

| | | |
|---|---|---|
| EP | 0 455 455 A2 | 11/1991 |
| EP | 1361023 | 11/2003 |
| JP | 58-171264 | 10/1983 |
| JP | 61-079666 | 4/1986 |
| JP | 6-1265279 | 11/1986 |
| JP | 63-028512 | 2/1988 |
| JP | 05277957 | 10/1993 |
| JP | 06-047678 | 2/1994 |
| JP | 10-006213 | 1/1998 |
| JP | 10-270412 | 10/1998 |
| JP | 11-042554 | 2/1999 |
| JP | 2870537 | 3/1999 |
| JP | 11-285962 | 10/1999 |
| JP | 2000-218513 | 8/2000 |
| JP | 11-216663 | 12/2000 |
| JP | 2001-77117 | 3/2001 |
| JP | 2001-179611 | 7/2001 |
| JP | 2001-244223 | 9/2001 |
| JP | 2001-284300 | 10/2001 |
| JP | 2002-093758 | 3/2002 |
| JP | 3453352 | 10/2003 |
| KR | 2003-037158 | 5/2003 |
| SU | 1618538 | 1/1991 |
| TW | 434110 | 5/2001 |
| TW | 446601 | 7/2001 |
| TW | 578641 | 3/2004 |
| TW | 592164 | 6/2004 |
| WO | WO 93/15879 | 8/1993 |
| WO | WO 98/49723 | 11/1998 |
| WO | WO 99/41434 | 8/1999 |
| WO | WO 99/53119 | 10/1999 |
| WO | WO 99/65072 | 12/1999 |
| WO | WO 00/03426 | 1/2000 |
| WO | WO 00/26443 | 5/2000 |
| WO | WO 00/33356 | 6/2000 |
| WO | WO 00/59682 | 10/2000 |
| WO | WO 00/71297 | 11/2000 |
| WO | WO 01/13416 | 2/2001 |
| WO | WO 01/49452 | 7/2001 |
| WO | WO 01/52307 | 7/2001 |
| WO | WO 01/63018 | 8/2001 |
| WO | WO 01/71066 | 9/2001 |
| WO | WO 01/88229 | 11/2001 |
| WO | WO 01/88954 | 11/2001 |
| WO | WO 02/23616 | 3/2002 |
| WO | WO 02/064314 | 8/2002 |
| WO | WO 02/075804 | 9/2002 |
| WO | WO 03/001581 | 1/2003 |
| WO | WO 03/099519 A1 | 12/2003 |
| WO | WO 2004/073926 A1 | 9/2004 |

OTHER PUBLICATIONS

Contolini, "Electrochemical Planarization of ULSI Copper," Solid State Technology, vol. 40, No. 6, Jun. 1, 1997.

Nogami, "An Innovation in Integrate Porous Low-K Materials and Copper," InterConnect Japan 2001; Honeywell Seminar Dec. 6, 2001, p. 1-12.

Taiwan Office Action dated Dec. 25, 2007 for Taiwan Application No. 092121222.

European Examination Report dated Sep. 9, 2007 for European Application No. 05077958.6.

European Search Report dated Sep. 27, 2005 for Application No. 03254807.5.

PCT International Search Report and Written Opinion for PCT/US2006/004114, dated Jul. 14, 2006.

Korean Office Action dated Mar. 26, 2008 for Korean Application No. 10-2007-7023166.

Partial International Search / PCT Invitation to pay additional fees dated Nov. 14, 2002.

Notification regarding review of justification for invitation to pay additional fees for PCT/US/02/11009 dated Feb. 25, 2003.

International Search Report for PCT/US 02/11009 dated Feb. 25, 2003.

PCT Written Opinion dated Apr. 1, 2003 for PCT/US02/11009.

Notification of Transmittal of International Preliminary Examination Report dated Nov. 10, 2003.

European Search Report for 03252801.0, dated Jan. 16, 2004 (7047 EP).

Communication pursuant to Article 96(2) EPC for Application No. 02728965.4, dated Jun. 11, 2004.

Search Report issued by the Austrian Patent Office for corresponding Singapore Patent Application No. 200302562-4, provided by letter dated Oct. 7, 2004.

Invitation to pay additional fees dated Nov. 11, 2004.

Notification of Transmittal of International Search Report and Written Opinion dated Feb. 21, 2005.

Notification of transmittal of the International Search report and Written Opinion dated Mar. 14, 2005.

PCT International Search Report and Written Opinion dated Apr. 28, 2005 for PCT/US04/037870.

Taiwan Office Action issued Oct. 27, 2008, in Taiwan Patent Application No. 93136038.

First Office Action dated Nov. 7, 2008 for Chinese Patent Application No. 200480022037.9.

Korean Office Action, Korean Patent Application No. 10-2007-7023166, dated Dec. 19, 2008.

Japanese Office Action, Patent Application No. P2003-205790, dated Jan. 27, 2009.

First Office Action issued Feb. 20, 2009 in Chinese Patent Application No. 200480019124.9.

\* cited by examiner

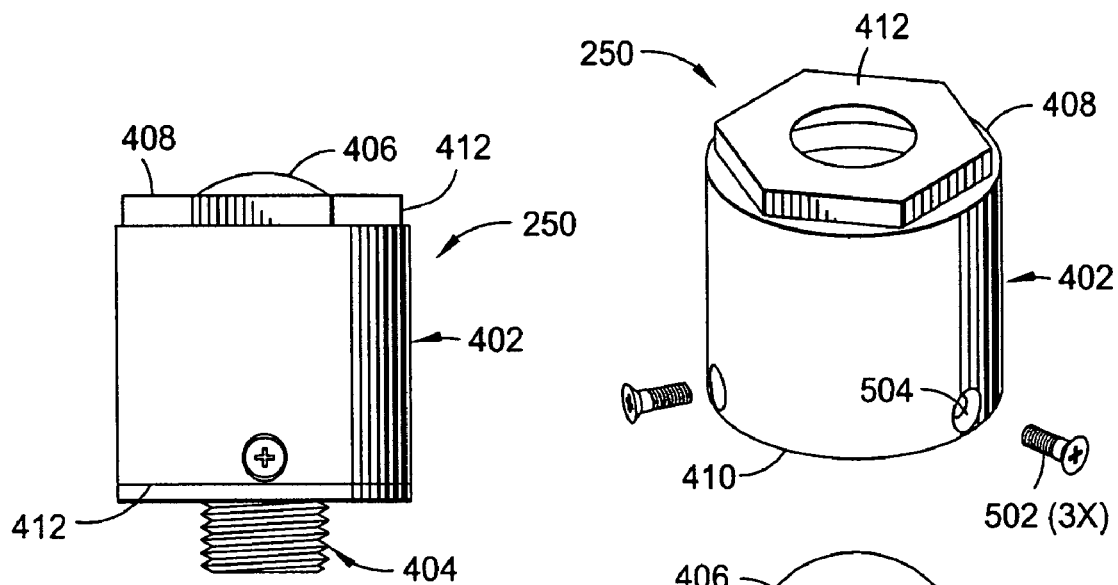
FIG. 5A
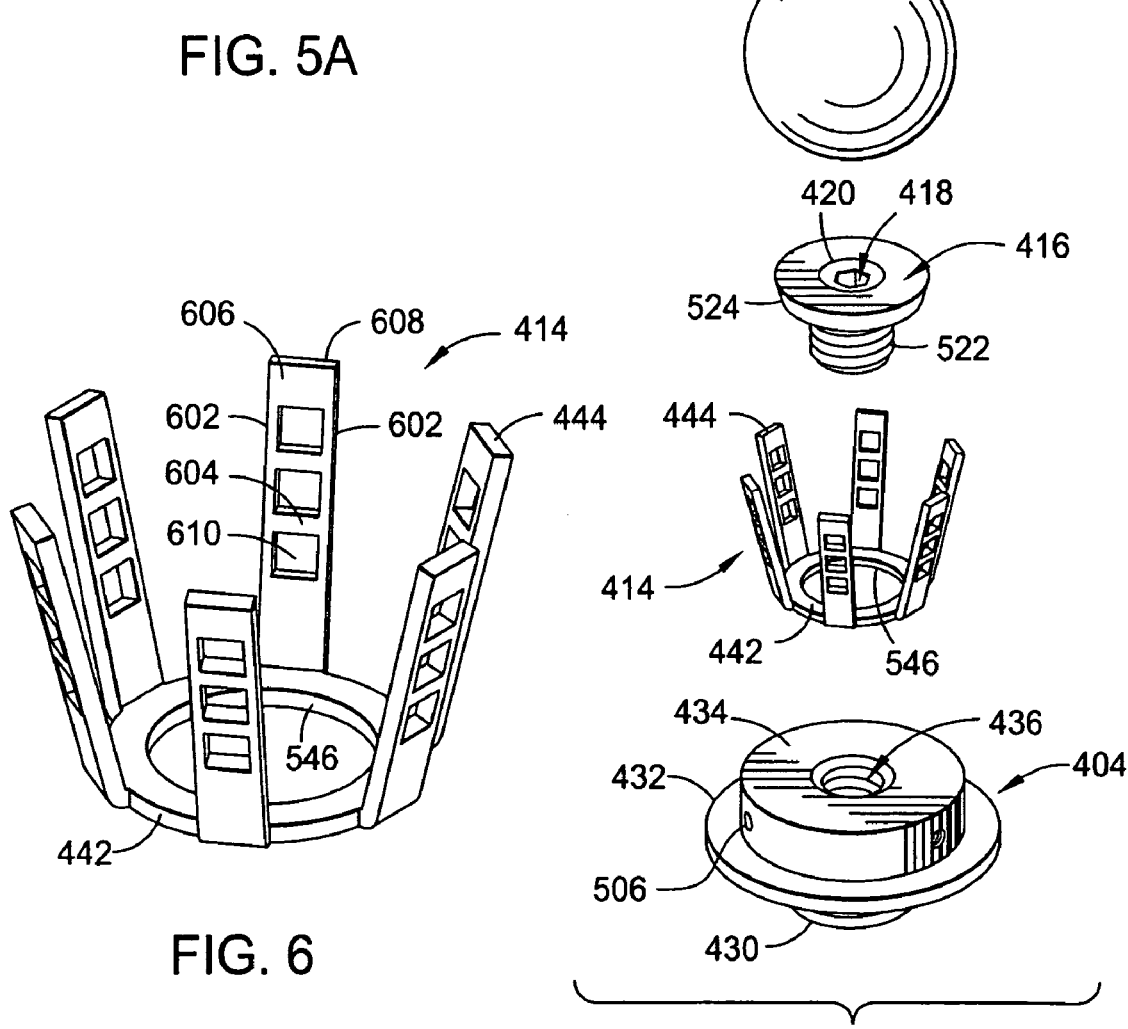
FIG. 6
FIG. 5B

METHOD AND APPARATUS FOR ELECTROCHEMICAL MECHANICAL PROCESSING

CROSS-REFERENCE TO RELATED APPLICATIONS

This application claims benefit of U.S. Provisional Patent Application Ser. No. 60/484,189, filed Jul. 1, 2003, and U.S. Provisional Patent Application Ser. No. 60/516,680, filed Nov. 3, 2003, both of which are herein incorporated by reference. This application is additionally a continuation-in-part of U.S. patent application Ser. No. 10/608,513, filed Jun. 26, 2003 now U.S. Pat. No. 7,374,644 (hereinafter referred to as the "'513 application"), which is a continuation-in-part of U.S. patent application Ser. No. 10/140,010, filed May 7, 2002 now U.S. Pat. No. 6,979,248. The '513 application is also a continuation-in-part of U.S. patent application Ser. No. 10/211,626, filed Aug. 2, 2002 now U.S. Pat. No. 7,125,477, which is a continuation-in-part of U.S. patent application Ser. No. 10/033,732, filed Dec. 27, 2001 now U.S. Pat. No. 7,055,800, which is a continuation-in-part of U.S. patent application Ser. No. 09/505,899, filed Feb. 17, 2000 now U.S. Pat. No. 6,537,144. The '513 application is additionally a continuation-in-part of U.S. patent application Ser. No. 10/210,972, filed Aug. 2, 2002 now U.S. Pat. No. 7,303,662, which is also a continuation-in-part of U.S. patent application Ser. No. 09/505,899, filed Feb. 17, 2000 now U.S. Pat. No. 6,537,144. The '513 application is further continuation-in-part of U.S. patent application Ser. No. 10/151,538, filed May 16, 2002 now abandoned. This application is also a continuation-in-part of U.S. patent application Ser. No. 10/244,697, filed Sep. 16, 2002 now U.S. Pat. No. 6,991,526, which is a continuation-in-part of U.S. application Ser. No. 10/244,688, filed Sep. 16, 2002 now U.S. Pat. No. 6,848,970, and of co-pending U.S. patent application Ser. No. 10/391,324, filed Mar. 18, 2003. All of the above referenced applications are hereby incorporated by reference in their entireties.

This application is additionally related to U.S. patent application Ser. No. 10/455,941, filed Jun. 6, 2003; and U.S. patent application Ser. No. 10,455,895, filed Jun. 6, 2003, all of which are also incorporated herein by reference in their entireties.

BACKGROUND OF THE INVENTION

1. Field of the Invention

Embodiments of the present invention generally relate to a method and apparatus for electrochemical mechanical processing.

2. Description of the Related Art

Electrochemical mechanical planarizing (ECMP) is a technique used to remove conductive materials from a substrate surface by electrochemical dissolution while concurrently polishing the substrate with reduced mechanical abrasion compared to conventional planarization processes. ECMP systems may generally be adapted for deposition of conductive material on the substrate by reversing the polarity of the bias. Electrochemical dissolution is performed by applying a bias between a cathode and a substrate surface to remove conductive materials from the substrate surface into a surrounding electrolyte. Typically, the bias is applied to the substrate surface by a conductive polishing material on which the substrate is processed. A mechanical component of the polishing process is performed by providing relative motion between the substrate and the conductive polishing material that enhances the removal of the conductive material from the substrate.

Copper is one material that may be polished using electrochemical mechanical planarizing. Typically, copper is polished utilizing a two-step process. In the first step, the bulk of the copper is removed, typically leaving some copper residue projecting above the substrate's surface. The copper residue is then removed in a second, or over-polishing, step.

However, the removal of copper residue may result in dishing of copper features below the plane of a surrounding material, typically an oxide Or a barrier layer of other materials, such as TaN, and the like. The amount of dishing typically is related to polishing chemistries and processing parameters utilized in the over-polish step, along with the width of the copper features subjected to polishing. As the copper layer does not have a uniform thickness across the substrate, it is difficult to remove all the copper residue without causing dishing over some features and not removing all of the copper residue over others. However, at the present time, it is difficult to perform both bulk and residual material removal at a single polishing station. Thus, it would be advantageous to perform bulk and residual material removal on polishing stations optimized for those processes to enhance substrate throughput while providing copper residue removal and minimized dishing.

Thus, there is a need for an improved method and apparatus electrochemical mechanical planarizing.

SUMMARY OF THE INVENTION

Embodiments of the invention generally provide a method and apparatus for processing a substrate in an electrochemical mechanical planarizing system. In one embodiment, a cell for processing a substrate includes a processing pad disposed on a top surface of a platen assembly. A plurality of conductive elements are arranged in a spaced-apart relation across the upper planarizing surface. An electrode is disposed between the pad and the platen assembly. A plurality of passages are formed through the platen assembly between the top surface and a plenum defined within the platen assembly.

In another embodiment, a system for processing a substrate includes a first electrochemical mechanical planarizing station and at least a second electrochemical mechanical planarizing station disposed in an enclosure. A transfer mechanism is adapted to transfer substrates between the planarizing stations. A first processing pad assembly is disposed in the first electrochemical mechanical planarizing station and has an upper dielectric planarizing surface that is substantially dielectric across a substrate processing area. A plurality of conductive elements are arranged in a spaced-apart relation across the upper planarizing surface of the first processing pad assembly. A second processing pad assembly is disposed in the second electrochemical mechanical planarizing station and has an upper conductive planarizing surface that is substantially conductive across a substrate processing area.

In another embodiment, a method for electrochemically processing a substrate is provided. In one embodiment, a method for electrochemically processing a substrate includes the steps of biasing a conductive element in contact with a substrate relative to an electrode electrically coupled to the substrate by a processing fluid, electrically separating the substrate from the conductive element, and applying a negative bias to the separated conductive element.

In another embodiment, a method for electrochemically processing a substrate includes the steps of applying a first electrical bias to discreet portions of a surface of the substrate through a plurality of conductive elements extending through a planarizing material, and applying a second electrical bias to the surface of the substrate through a uniformly biased conductive planarizing material.

BRIEF DESCRIPTION OF THE DRAWINGS

So that the manner in which the above recited embodiments of the invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

FIGS. 5A-B are side and exploded views of one embodiment of a contact assembly;

FIG. 6 is one embodiment of a contact element;

To facilitate understanding, identical reference numerals have been used, where possible, to designate identical elements that are common to the figures.

DETAILED DESCRIPTION

Embodiments for a system and method for the bulk and residual removal of conductive material from a substrate is provided. Although the system is illustratively described having at least two processing stations suitable for the removal of conductive material disposed around a central substrate transfer device, it is contemplated that the inventive processing stations may be arranged in other configurations, and/or be supplied substrates by other types or configurations of substrate transfer mechanisms. Furthermore, although the embodiments disclosed below focus primarily on removing material from, e.g., planarizing, a substrate, it is contemplated that the teachings disclosed herein may be used to electroplate a substrate by reversing the polarity of the bias.

Figure 1:
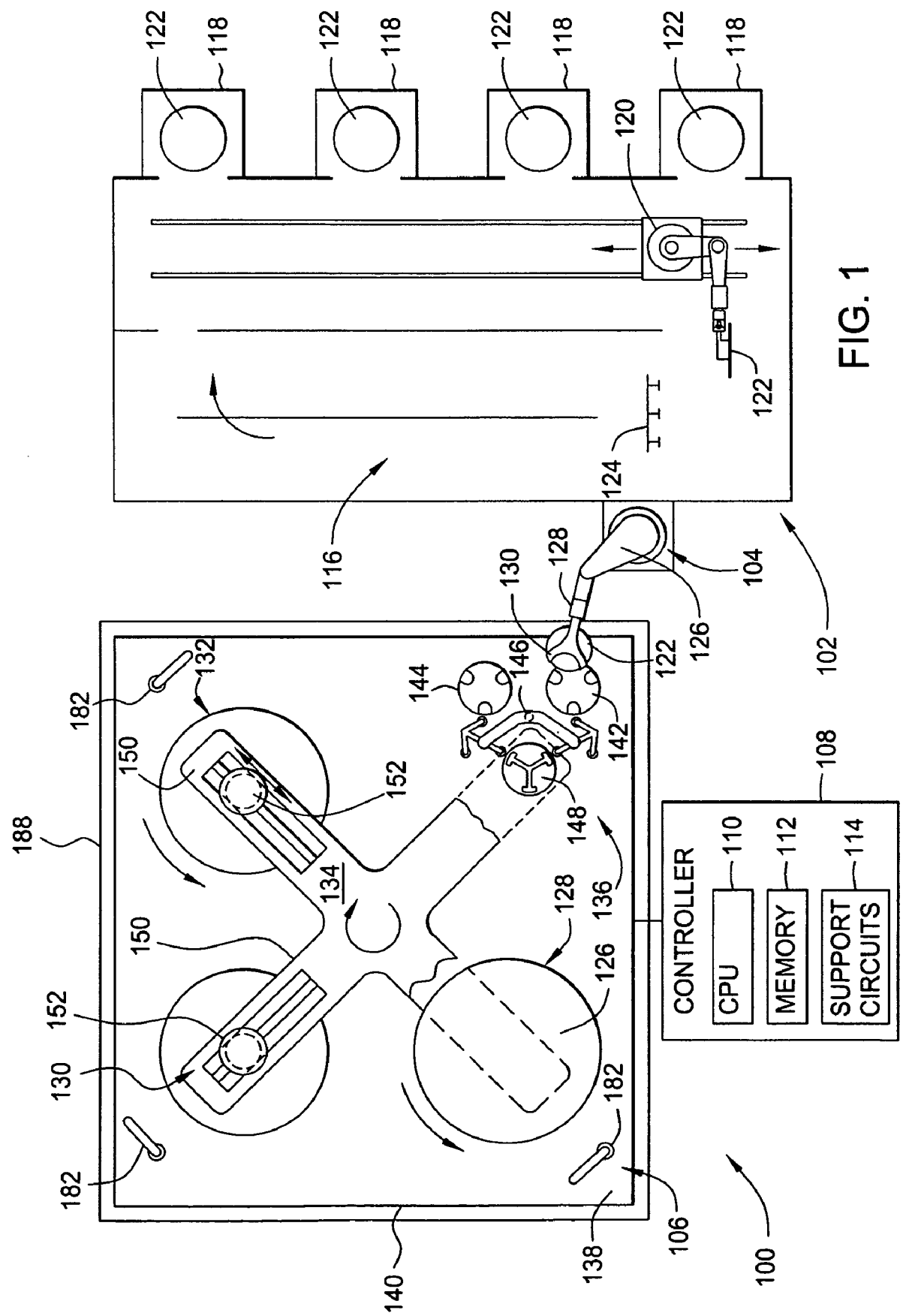
FIG. 1 is a plan view of an electrochemical mechanical planarizing system.

FIG. 1 is a plan view of one embodiment of a planarization system 100 having an apparatus for electrochemically processing a substrate. The exemplary system 100 generally comprises a factory interface 102, a loading robot 104, and a planarizing module 106. The loading robot 104 is disposed proximate the factory interface 102 and the planarizing module 106 to facilitate the transfer of substrates 122 therebetween.

A controller 108 is provided to facilitate control and integration of the modules of the system 100. The controller 108 comprises a central processing unit (CPU) 110, a memory 112, and support circuits 114. The controller 108 is coupled to the various components of the system 100 to facilitate control of, for example, the planarizing, cleaning, and transfer processes.

The factory interface 102 generally includes a cleaning module 116 and one or more wafer cassettes 118. An interface robot 120 is employed to transfer substrates 122 between the wafer cassettes 118, the cleaning module 116 and an input module 124. The input module 124 is positioned to facilitate transfer of substrates 122 between the planarizing module 106 and the factory interface 102 by grippers, for example vacuum grippers or mechanical clamps.

The planarizing module 106 includes at least one bulk electrochemical mechanical planarizing (ECMP) station 128, and optionally, at least one conventional chemical mechanical planarizing (CMP) stations 132 disposed in an environmentally controlled enclosure 188. Examples of planarizing modules 106 that can be adapted to benefit from the invention include MIRRA®, MIRRA MESA™, REFLEXION® , REFLEXION® LK, and REFLEXION LK Ecmp™ Chemical Mechanical Planarizing Systems, all available from Applied Materials, Inc. of Santa Clara, Calif. Other planarizing modules, including those that use processing pads, planarizing webs, or a combination thereof, and those that move a substrate relative to a planarizing surface in a rotational, linear or other planar motion may also be adapted to benefit from the invention.

In the embodiment depicted in FIG. 1, the planarizing module 106 includes one bulk ECMP station 128, a second ECMP station 130 and one CMP station 132. Bulk removal of conductive material from the substrate is performed through an electrochemical dissolution process at the bulk ECMP station 128. After the bulk material removal at the bulk ECMP station 128, residual conductive material is removed from the substrate at the residual ECMP station 130 through a second electrochemical mechanical process. It is contemplated that more than one residual ECMP stations 130 may be utilized in the planarizing module 106.

A conventional chemical mechanical planarizing process is performed at the planarizing station 132 after processing at the residual ECMP station 130. An example of a conventional CMP process for the removal of copper is described in U.S. Pat. No. 6,451,697, issued Sep. 17, 2002, which is incorporated by reference in its entirety. An example of a conventional CMP process for the barrier removal is described in U.S. patent application Ser. No. 10/187,857, filed Jun. 27, 2002, which is incorporated by reference in its entirety. It is contemplated that other CMP processes may be alternatively performed. As the CMP stations 132 are conventional in nature, further description thereof has been omitted for the sake of brevity.

The exemplary planarizing module 106 also includes a transfer station 136 and a carousel 134 that are disposed on an upper or first side 138 of a machine base 140. In one embodiment, the transfer station 136 includes an input buffer station 142, an output buffer station 144, a transfer robot 146, and a load cup assembly 148. The input buffer station 142 receives substrates from the factory interface 102 by the loading robot 104. The loading robot 104 is also utilized to return polished substrates from the output buffer station 144 to the factory interface 102. The transfer robot 146 is utilized to move substrates between the buffer stations 142, 144 and the load cup assembly 148.

In one embodiment, the transfer robot 146 includes two gripper assemblies, each having pneumatic gripper fingers that hold the substrate by the substrate's edge. The transfer robot 146 may simultaneously transfer a substrate to be processed from the input buffer station 142 to the load cup assembly 148 while transferring a processed substrate from the load cup assembly 148 to the output buffer station 144. An example of a transfer station that may be used to advantage is described in U.S. Pat. No. 6,156,124, issued Dec. 5, 2000 to Tobin, which is herein incorporated by reference in its entirety.

The carousel 134 is centrally disposed on the base 140. The carousel 134 typically includes a plurality of arms 150, each supporting a planarizing head assembly 152. Two of the arms 150 depicted in FIG. 1 are shown in phantom such that a planarizing surface 126 of the bulk ECMP station 128 and the transfer station 136 may be seen. The carousel 134 is indexable such that the planarizing head assemblies 152 may be moved between the planarizing stations 128, 132 and the transfer station 136. One carousel that may be utilized to advantage is described in U.S. Pat. No. 5,804,507, issued Sep. 8, 1998 to Perlov, et al., which is hereby incorporated by reference in its entirety.

A conditioning device 182 is disposed on the base 140 adjacent each of the planarizing stations 128, 132. The conditioning device 182 periodically conditions the planarizing material disposed in the stations 128, 132 to maintain uniform planarizing results.

Figure 2:
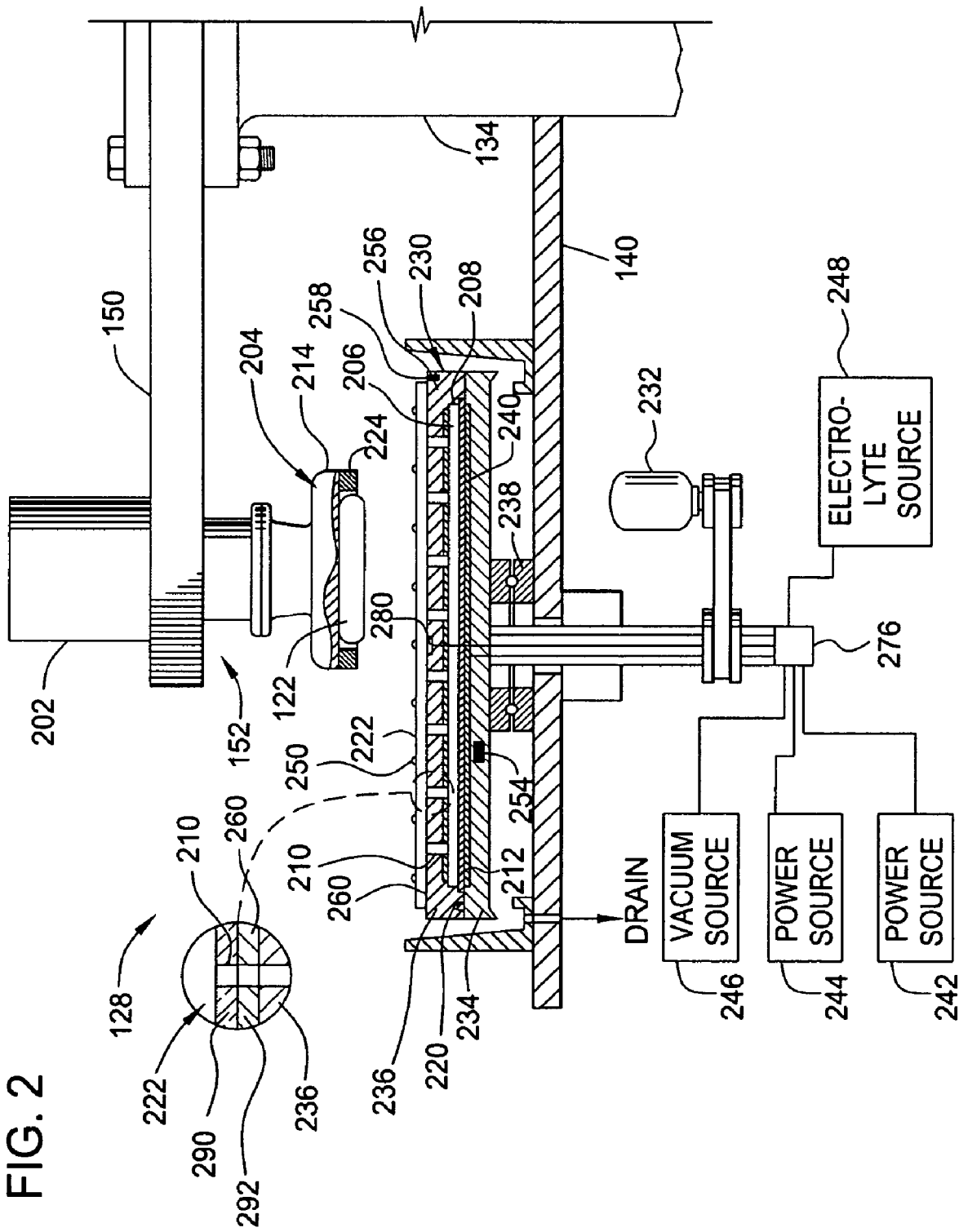
FIG. 2 is a sectional view of one embodiment of a bulk electrochemical mechanical planarizing (ECMP) station of the system of FIG. 1.

FIG. 2 depicts a sectional view of one of the planarizing head assemblies 152 positioned over one embodiment of the bulk ECMP station 128. The planarizing head assembly 152 generally comprises a drive system 202 coupled to a planarizing head 204. The drive system 202 generally provides at least rotational motion to the planarizing head 204. The planarizing head 204 additionally may be actuated toward the bulk ECMP station 128 such that the substrate 122 retained in the planarizing head 204 may be disposed against the planarizing surface 126 of the bulk ECMP station 128 during processing. The drive system 202 is coupled to the controller 108 that provides a signal to the drive system 202 for controlling the rotational speed and direction of the planarizing head 204.

In one embodiment, the planarizing head may be a TITAN HEAD™ or TITAN PROFILER™ wafer carrier manufactured by Applied Materials, Inc. Generally, the planarizing head 204 comprises a housing 214 and retaining ring 224 that defines a center recess in which the substrate 122 is retained. The retaining ring 224 circumscribes the substrate 122 disposed within the planarizing head 204 to prevent the substrate from slipping out from under the planarizing head 204 while processing. The retaining ring 224 can be made of plastic materials such as PPS, PEEK, and the like, or conductive materials such as stainless steel, Cu, Au, Pd, and the like, or some combination thereof. It is further contemplated that a conductive retaining ring 224 may be electrically biased to control the electric field during ECMP. It is contemplated that other planarizing heads may be utilized.

The bulk ECMP station 128 generally includes a platen assembly 230 that is rotationally disposed on the base 140. The platen assembly 230 is supported above the base 140 by a bearing 238 so that the platen assembly 230 may be rotated relative to the base 140. An area of the base 140 circumscribed by the bearing 238 is open and provides a conduit for the electrical, mechanical, pneumatic, control signals and connections communicating with the platen assembly 230.

Conventional bearings, rotary unions and slip rings, collectively referred to as rotary coupler 276, are provided such that electrical, mechanical, fluid, pneumatic, control signals and connections may be coupled between the base 140 and the rotating platen assembly 230. The platen assembly 230 is typically coupled to a motor 232 that provides the rotational motion to the platen assembly 230. The motor 232 is coupled to the controller 108 that provides a signal for controlling for the rotational speed and direction of the platen assembly 230.

The platen assembly 230 has an upper plate 236 and a lower plate 234. The upper plate 236 may be fabricated from a rigid material, such as a metal or rigid plastic, and in one embodiment, is fabricated from or coated with a dielectric material, such as CPVC. The upper plate 236 may have a circular, rectangular or other plane form. A top surface 260 of the upper plate 236 supports a processing pad assembly 222 thereon.

The lower plate 234 is generally fabricated from a rigid material, such as aluminum. In the embodiment depicted in FIG. 2, the upper and lower plates 236, 234 are coupled by a plurality of fasteners 228. Generally, a plurality of locating pins 220 (one is shown in FIG. 2) are disposed between the upper and lower plates 236, 234 to ensure alignment therebetween. The upper plate 236 and the lower plate 234 may optionally be fabricated from a single, unitary member.

Optionally, a magnetic element 240 may be disposed within the platen assembly 230 and is adapted to urge the processing pad assembly 222 toward the platen assembly 230. The magnetic element 240 is coupled to a power source 244 through the rotary coupler 276. It is contemplated that the magnetic element 240 may be coupled to the pad assembly 222 such that the pad assembly 222 is attracted to the platen assembly 230.

In the embodiment of FIG. 2, the magnetic element 240 is magnetically coupled to the conductive material (i.e., metallic material) disposed in, on or coupled to the processing pad assembly 222. The magnetic attraction between the magnetic element 240 and processing pad assembly 222 pulls the processing pad assembly 222 against the top surface 260 of the platen assembly 230 such that the processing pad assembly 222 advantageously remains stationary relative to the platen assembly 230 during processing.

The magnet element 240 is generally disposed parallel to the top surface 260 of the platen assembly 230. This orientation generally enhances force uniformity of the processing pad assembly 222 against the top surface 260 of the platen assembly 230.

In one embodiment, the magnetic element 240 is an electromagnet disposed between the upper plate 236 and the lower plate 234 of the platen assembly 230. The magnetic element 240 may be selectively energized by the power source 244 to create a bias force attracting the processing pad assembly 222 to the platen assembly 230. As the magnetic force applied by the magnetic element 240 is easily regulated by the power source 244, the contact force between the processing pad assembly 222 and the platen assembly 230 may be optimally tailored for specific processing routines. Moreover, as the attraction force between the processing pad assembly 222 and the platen assembly 230 may be removed by interrupting power applied to the magnetic element 240, the processing pad assembly 222 may be easily separated from the platen assembly 230. Optionally, the polarity of the magnetic force generated by the magnetic element 240 may be reversed to assist removing the processing pad assembly 222 in instances where the processing pad assembly 222 has become magnetized and/or contains permanent magnetic material. Alternatively, the magnetic element 240 may be a permanent magnet.

It is contemplated that the magnetic element 240 may be disposed in other positions within or adjacent the platen assembly 230. It is also contemplated that planarizing material support surfaces of planarizing stations having alternative and diverse designs may be adapted to incorporate a magnetic element 240 to provide an attractive force for securing a processing pad assembly 222 to the surface supporting the processing pad assembly 222.

The platen assembly 230 may optionally include a vacuum port 280 disposed in the top surface 260 of the platen assembly 230 supporting the processing pad assembly 222. The vacuum port 280 is coupled to a vacuum source 246 configured to selectively apply a vacuum to retain the processing pad assembly 222 against the platen assembly 230.

A plenum 206 is defined in the platen assembly 230. The plenum 206 may be partially formed in at least one of the upper or lower plates 236, 234. In the embodiment depicted in FIG. 2, the plenum 206 is defined in a recess 208 partially formed in the lower surface 262 of the upper plate 236. A plurality of holes 210 are formed in the upper plate 236 to allow electrolyte, provided to the plenum 206 from an electrolyte source 248, to flow uniformly though the platen assembly 230 and into contact with the substrate 122 during processing. The plenum 206 is partially bounded by a cover 212 coupled to the upper plate 236 enclosing the recess 208.

Figure 3:
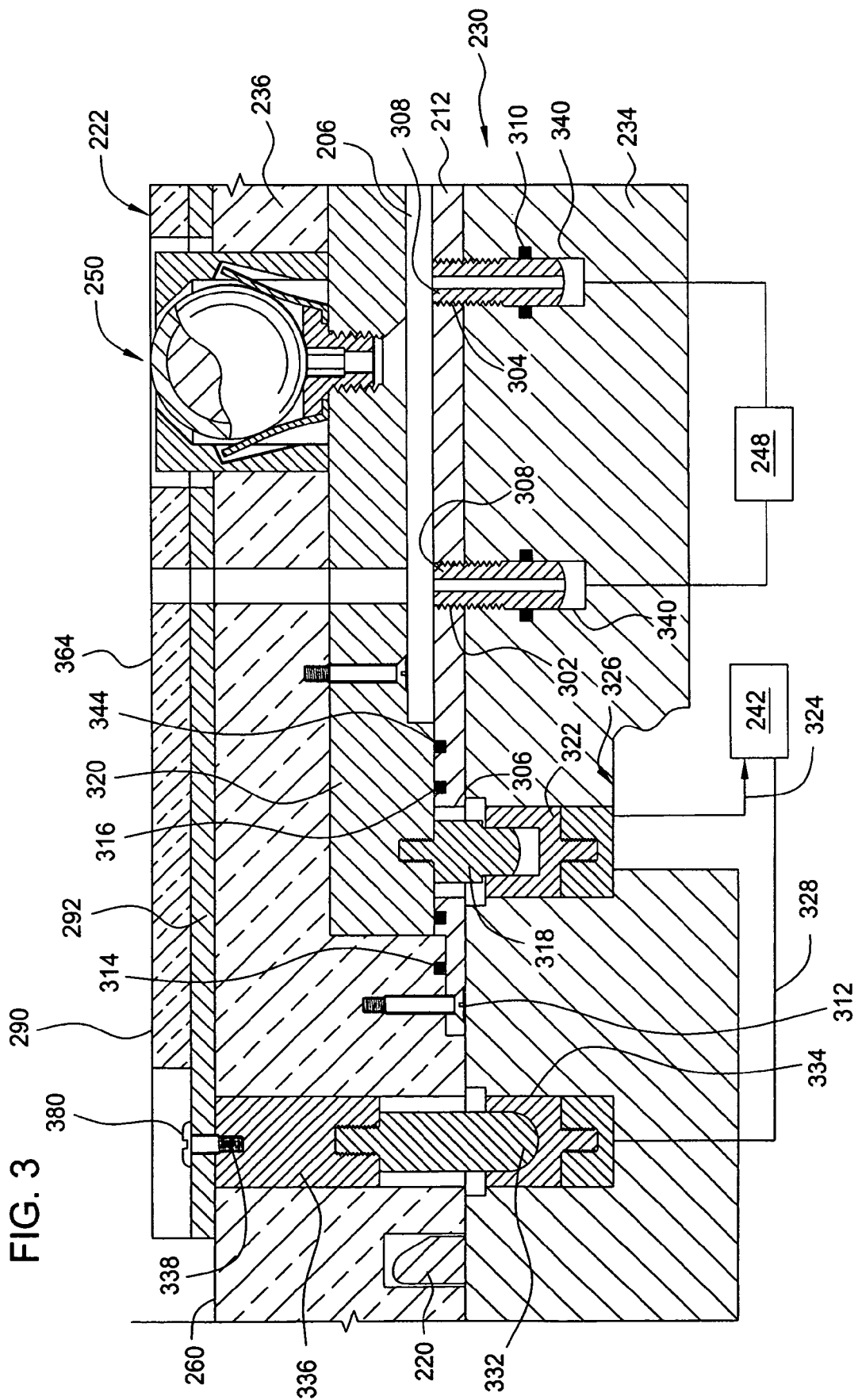
FIG. 3 is a partial sectional view of one embodiment of a platen assembly of the bulk ECMP station of FIG. 2.

FIG. 3 is a partial sectional view of the platen assembly 230 showing one embodiment of the cover 212 in greater detail. The cover 212 is sealing coupled to the upper plate 236. In the embodiment depicted in FIG. 3, a plurality of fasteners 312 urge the cover 212 against the upper plate 236, compressing a plenum seal 314 disposed between the cover 212 and upper plate 236. The plenum seal 314 may be a gasket, o-ring, lip seal or other seal that is compatible with process chemistries.

The cover 212 includes a first aperture 302, a second aperture 304 and a third aperture 306. The first and second apertures 302, 304 provide an inlet and outlet that couple the plenum 206 through the cover 212 to the electrolyte source 248. In one embodiment, the first and second apertures 302, 304 are threaded to accept male fittings 308 that mate with holes 340 formed in the lower plate 234. A radial seal 310, for example, an o-ring or lobed seal, is disposed between the fittings 308 and bore of the holes 340 to provide a fluid seal that prevents electrolyte from leaking out of the plenum 206 through the cover 212.

The third aperture 306 is circumscribed by a seal 316 that isolates the third aperture 306 from electrolyte disposed within the plenum 206. In one embodiment, the seal 316 is positioned outward of second plenum seal 344 to provide an additional barrier between the first bayonet fitting 318 and the electrolyte disposed in the plenum 206. The third aperture 306 is configured to permit a first bayonet fitting 318 to pass therethrough. The first bayonet fitting 318 couples a contact plate 320, disposed in the plenum 206 and coupled to the upper plate 236, to a socket 322 disposed in the lower plate 234. The socket 322 is coupled by a first power line 324 disposed in a passage 326 formed in the lower plate 326 to the power source 242 through the rotary coupler 276 (as shown in FIG. 2).

A second line 328 is disposed through the lower plate 234 coupling a socket 334 disposed proximate the perimeter of the lower plate 234 to the power source 242. A second bayonet fitting 332 is coupled to a contact member 336 disposed in the upper plate 236. The contact member 336 includes a threaded hole 338 or other element exposed to the top surface 260 of the upper plate 236 that is suitable for electrically coupling the contact member 336 to the processing pad assembly 222. In the embodiment depicted in FIG. 3, the processing pad assembly 222 is coupled by the second bayonet fitting 332 to the power source 242.

The bayonet fittings 318, 332 and locating pins 220 facilitate alignment of the plates 234, 236 while fluid and electrical connection are made as the upper plate 236 is disposed on the lower plate 234. This advantageously provides both ease of assembly with robust electrical and fluid coupling between the plates 234, 236.

Referring additionally to FIG. 2, the processing pad assembly 222 includes an electrode 292 and at least a planarizing portion 290. At least one contact assembly 250 extends above the processing pad assembly 222 and is adapted to electrically couple the substrate being processing on the processing pad assembly 222 to the power source 242.

The electrode 292 is also coupled to the power source 242 so that an electrical potential may be established between the substrate and electrode 292. In one embodiment the electrode 292 is electrically coupled to the power source 242 by a fastener 380 disposed through the electrode 292 and engaging the threaded hole 338 of the contact member 336 (as shown in FIG. 3).

The electrode 292 is typically comprised of a conductive material, such as stainless steel, copper, aluminum, gold, silver and tungsten, among others. The electrode 292 may be solid, impermeable to electrolyte, permeable to electrolyte or perforated. In the embodiment depicted in FIG. 3, the electrode 292 is configured to allow electrolyte therethrough. The electrode 292 may be permeable, have holes formed therethrough or a combination thereof. The electrode 292 is disposed on the top surface 260 of the platen assembly 230 and is coupled to the power source 242 through the platen assembly 230.

Embodiments of the processing pad assembly 222 suitable for bulk removal of material from the substrate 122 may generally include a planarizing surface that is substantially dielectric. As the conductive material to be removed from the substrate 122 substantially covers the substrate 122, fewer contacts for biasing the substrate 122 are required. Embodiments of the processing pad assembly 222 suitable for residual removal of material from the substrate 122 may generally include a planarizing surface that is substantially conductive. As the conductive material to be removed from the substrate 122 comprises isolated islands of material disposed on the substrate 122, more contacts for biasing the substrate 122 are required.

In one embodiment, the planarizing layer 290 of the processing pad assembly 222 may include a planarizing surface 364 that is dielectric, such as a polyurethane pad. Examples of processing pad assemblies that may be adapted to benefit from the invention are described in U.S. patent application Ser. No. 10/455,941, filed Jun. 6, 2003 by Y. Hu et al. (entitled "CONDUCTIVE PLANARIZING ARTICLE FOR ELECTROCHEMICAL MECHANICAL PLANARIZING") and U.S. patent application Ser. No. 10/455,895, filed Jun. 6, 2003 by Y. Hu et al. (entitled "CONDUCTIVE PLANARIZING ARTICLE FOR ELECTROCHEMICAL MECHANICAL PLANARIZING"), both of with are hereby incorporated by reference in their entireties.

Figure 4:
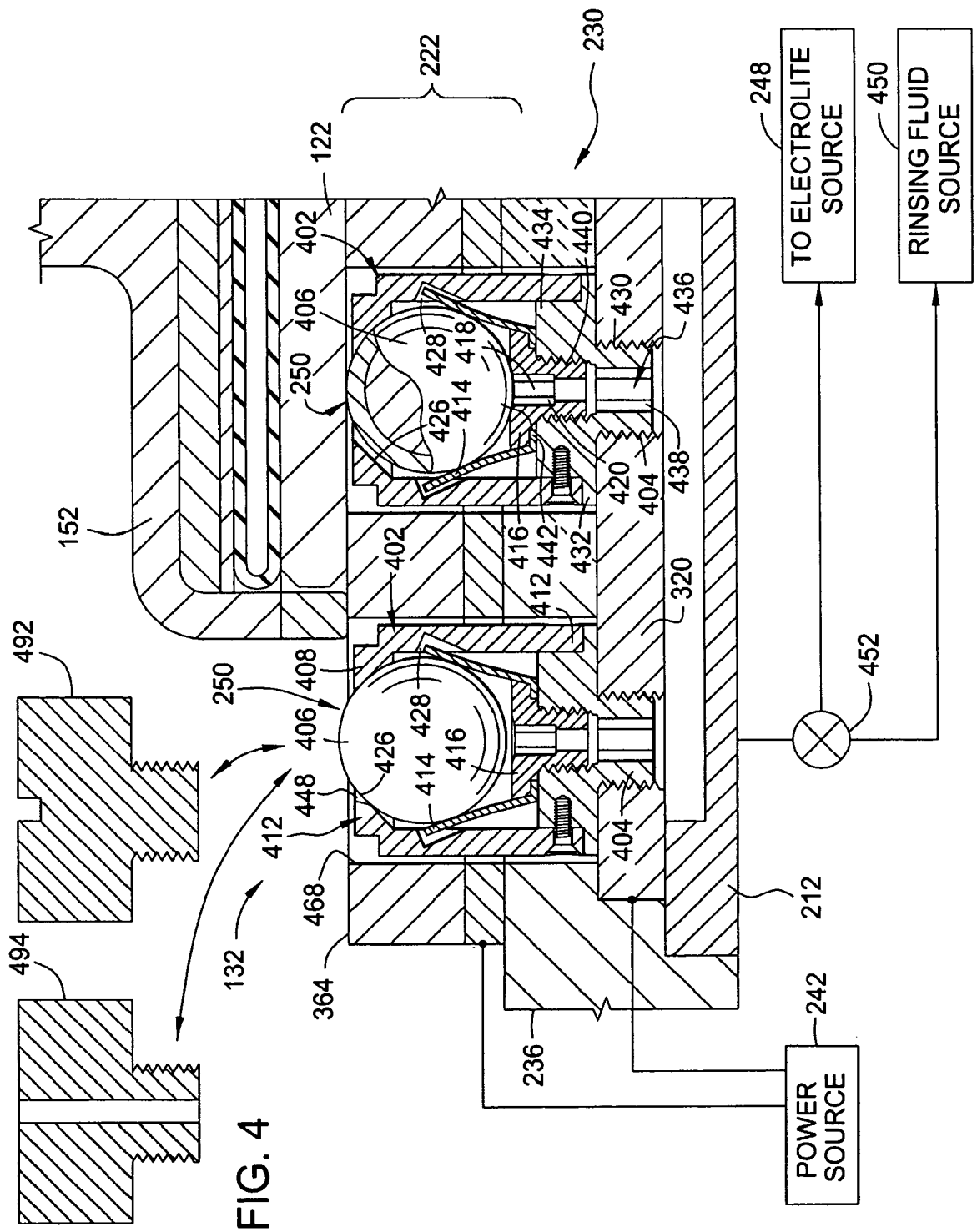
FIG. 4 is a partial sectional view of the bulk ECMP station through two contact assemblies.

FIG. 4 is a partial sectional view of the bulk ECMP station 128 through two contact assemblies 250, and FIGS. 5A-B are side and exploded views of one of the contact assemblies 250 shown in FIG. 4. The platen assembly 230 includes at least one contact assembly 250 projecting therefrom and coupled to the power source 242 that is adapted to bias a surface of the substrate 122 during processing. The contact assemblies 250 may be coupled to the platen assembly 230, part of the processing pad assembly 222, or a separate element. Although two contact assemblies 250 are shown in FIG. 4, any number of contact assemblies may be utilized and may be distributed in any number of configurations relative to the centerline of the upper plate 236.

The contact assemblies 250 are generally electrically coupled to the contact plate 320 through the upper plate 236 and extend at least partially through respective apertures 468 formed in the processing pad assembly 222. The position of the contact assemblies 250 may be chosen to have a predetermined configuration across the platen assembly 230. For predefined processes, individual contact assemblies 250 may be repositioned in different apertures 468, while apertures not containing contact assemblies may be plugged with a stopper 492 or filled with a nozzle 494 that allows flow of electrolyte from the plenum 206 to the substrate. One contact assembly that may be adapted to benefit from the invention is described in U.S. patent application Ser. No. 10/445,239, filed May 23, 2003, by Butterfield, et al., and is hereby incorporated by reference in its entirety.

Although the embodiments of the contact assembly 250 described below with respect to FIG. 4 depicts a rolling ball contact, the contact assembly 250 may alternatively comprise a structure or assembly having a conductive upper layer or surface suitable for electrically biasing the substrate 122. For example, the contact assembly 250 may include a structure having an upper layer made from a conductive material or a conductive composite (i.e., the conductive elements are dispersed integrally with or comprise the material comprising the upper surface), such as a polymer matrix having conductive particles dispersed therein or a conductive coated fabric, among others. Other examples of suitable contact assemblies are described in U.S. Provisional Patent Application Ser. No. 60/516,680, filed Nov. 3, 2003, by Hu, et al., which is hereby incorporated by reference in its entirety.

In one embodiment, each of the contact assemblies 250 includes a hollow housing 402, an adapter 404, a ball 406, a contact element 414 and a clamp bushing 416. The ball 406 has a conductive outer surface and is movably disposed in the housing 402. The ball 406 may be disposed in a first position having at least a portion of the ball 406 extending above the planarizing surface 364 and at least a second position where the ball 406 is flush with the planarizing surface 364. The ball 406 is generally suitable for electrically coupling the substrate 122 to the power source 242 through the contact plate 320.

The power source 242 generally provides a positive electrical bias to the ball 406 during processing. Between planarizing substrates, the power source negatively biases the ball 406 to minimize attack on the ball 406 by process chemistries.

The housing 402 is fabricated from a dielectric material compatible with process chemistries. In one embodiment, the housing 402 is made of PEEK. The housing 402 has a first end 408 and a second end 410. A drive feature 412 is formed in and/or on the first end 408 to facilitate installation of the contact assembly 250 to the contact plate 320. The drive feature 412 may be holes for a spanner wrench, a slot or slots, a recessed drive feature (such as for a TORX® or hex drive, and the like) or a projecting drive feature (such as wrench flats or a hex head, and the like), among others. The first end 408 additionally includes a seat 426 that prevents the ball 406 from passing out of the first end 408 of the housing 402. The seat 426 optionally may include one or more grooves 448 formed therein that allow fluid flow to exit the housing 402 between the ball 406 and seat 412. Maintaining fluid past the ball 406 may minimize the propensity of process chemistries to attack the ball 406.

The contact element 414 is coupled between the clamp bushing 416 and adapter 404. The contact element 414 is generally configured to electrically connect the adapter 404 and ball 406 substantially or completely through the range of ball positions within the housing 402. In one embodiment, the contact element 414 may be configured as a spring form.

In the embodiment depicted in FIGS. 4 and 5A-B and detailed in FIG. 6, the contact element 414 includes an annular base 442 having a plurality of flexures 444 extending therefrom in a polar array. The flexure 444 includes two support elements 602 extending from the base 442 to a distal end 608. The support elements 602 are coupled by a plurality of rungs 604 to define apertures 610 that facilitate flow past the contact element 416 with little pressure drop as discussed further below. A contact pad 606 adapted to contact the ball 406 couples the support elements 602 at the distal end 608 of each flexure 444. The flexure 444 is generally fabricated from a resilient and conductive material suitable for use with process chemistries. In one embodiment, the flexure 444 is fabricated from gold plated beryllium copper.

Returning to FIGS. 4 and 5A-B, the clamp bushing 416 includes a flared head 524 having a threaded post 522 extending therefrom. The clamp bushing may be fabricated from either a dielectric or conductive material, or a combination thereof, and in one embodiment, is fabricated from the same material as the housing 402. The flared head 524 maintains the flexures 444 at an acute angle relative to the centerline of the contact assembly 250 so that the contact pads 606 of the contact elements 414 are positioned to spread around the surface of the ball 406 to prevent bending, binding and/or damage to the flexures 444 during assembly of the contact assembly 250 and through the range of motion of the ball 406.

The post 522 of the clamp bushing 416 is disposed through a hole 546 in the base 442 and threads into a threaded portion 440 of a passage 436 formed through the adapter 404. A passage 418 formed through the clamp bushing 416 includes a drive feature 420 at an end disposed in the flared head 524. Similarly, the passage 436 includes a drive feature 438 in an end opposite the threaded portion 440. The drive features 420, 438 may be similar to those described above, and in one embodiment, are hexagonal holes suitable for use with a hex driver. The clamp bushing 424 is tightened to a level that ensures good electrical contact between the contact element 414 and the adapter 404 without damaging the contact element 414 or other component.

The adapter 404 is generally fabricated from an electrically conductive material compatible with process chemistries, and in one embodiment, is fabricated from stainless steel. The adapter 404 includes an annular flange 432 having a threaded post 430 extending from one side and a boss 434 extending from the opposite side. The threaded post 430 is adapted to mate with the contact plate 320 disposed in recess 208 of the upper plate 236 which couples the respective balls 406 in the contact assemblies 250 to the power source 242.

The boss 434 is received in the second end 410 of the housing 402 and provides a surface for clamping the contact element 414 thereto. The boss 434 additionally includes at least one threaded hole 506 disposed on the side of the boss 434 that engages a fastener 502 disposed through a hole 504 formed in the housing 402, thereby securing the housing 402 to the adapter 404 and capturing the ball 406 therein. In the embodiment depicted in FIG. 5A, three fasteners are shown for coupling the housing 402 to the adapter 404 through counter-sunk holes 504. It is contemplated that the housing 402 and adapter 404 may be fastened by alternative methods or devices, such as staking, adhering, bonding, press fit, dowel pins, spring pins, rivets and retaining rings, among others.

The ball 406 may be solid or hollow and is typically fabricated from a conductive material. For example, the ball 406 may be fabricated from a metal, conductive polymer or a polymeric material filled with conductive material, such as metals, conductive carbon or graphite, among other conductive materials. Alternatively, the ball 406 may be formed from a solid or hollow core that is coated with a conductive material. The core may be non-conductive and at least partially coated with a conductive covering. Examples of suitable core materials include acrylonitrile butadiene styrene (ABS), polypropylene (PP), polyethylene (PE), polystyrene (PS), or polyamide-imide (PAI) (such as TORLON®), and the like.

In one embodiment, the core may be selected from an elastic or a resilient polymer such as polyurethane that deforms when the ball 406 is in contact with the substrate 122 during planarizing. Some examples of materials that may be utilized for the core include elastic organic polymers, ethylene-propylene-diene (EDPM), poly-alkenes, polyalkynes, polyesters, poly-aromatic alkenes/alkynes, polyimide, polycarbonate, polyurethane, and there combinations. Other examples of core materials include inorganic polymers, such as siloxane, or organic and inorganic combined materials, such as polysilicon and polysilane. As the ball 406 deforms, the contact area between the ball 406 and the substrate increases, thus improving the current flow between the ball 406 and the conductive layer disposed on the substrate 122, thereby improving planarizing results.

In one embodiment, the ball 406 has a copper (including copper alloy) outer surface, and may be solid, hollow, or have a different core material. In another embodiment, the ball 406 may include a noble metal outer surface. In another embodiment, the ball 406 may include a TORLON® polymer core coated with conductive gold layer using copper as seeding layer between TORLON® and gold layer. Another example is TORLON® or other polymer core coated with a layer of copper or other conductive material. Other suitable soft conductive materials include, but are not limited to, silver, copper, tin, and the like.

The ball 404 is generally actuated toward the planarizing surface 364 by at least one of spring, buoyant or flow forces. In the embodiment depicted in FIG. 4, the passages 436, 418 formed through the adapter 404 and clamp bushing 416 are coupled through the upper plate 236 to the electrolyte source 248. The electrolyte source 248 provides electrolyte through the passages 436 and 418 into the interior of the hollow housing 402. The electrolyte exits the housing 402 between the seat 426 and ball 406, thus causing the ball 406 to be biased toward the planarizing surface 364 and into contact with the substrate 122 during processing.

So that the force upon the ball 406 is consistent across the different elevations of the ball 406 within the housing 402, a relief or groove 428 is formed in the interior wall of the housing 402 to accept the distal ends (608 in FIG. 6) of the flexures 444 to prevent restricting the flow of electrolyte passing the ball 408. An end of the groove 428 disposed away from the seat 426 is generally configured to being at or below the diameter of the ball 406 when the ball 406 is in the lowered position.

In one embodiment, electrochemical attack on the contact assembly 250 and/or balls 406 by processing chemistries may be minimized by maintaining the contact assembly 250 and/or balls 406 below the substrate during planarizing. This may be accomplished by positioning the contact assemblies 250 in a predefined location, or programming the relative motion between the substrate and platen assembly 230 to maintain the substrate over the balls 406. As the balls 406 are depressed, the planarizing material 222 may be configured to provide a fluid seal around each ball 406, thereby preventing a direct electrical path through the electrolyte between the electrode 292 and the balls 406, thus making the chemical reaction preferential to the conductive material on the substrate relative to the balls 406.

Figure 13:
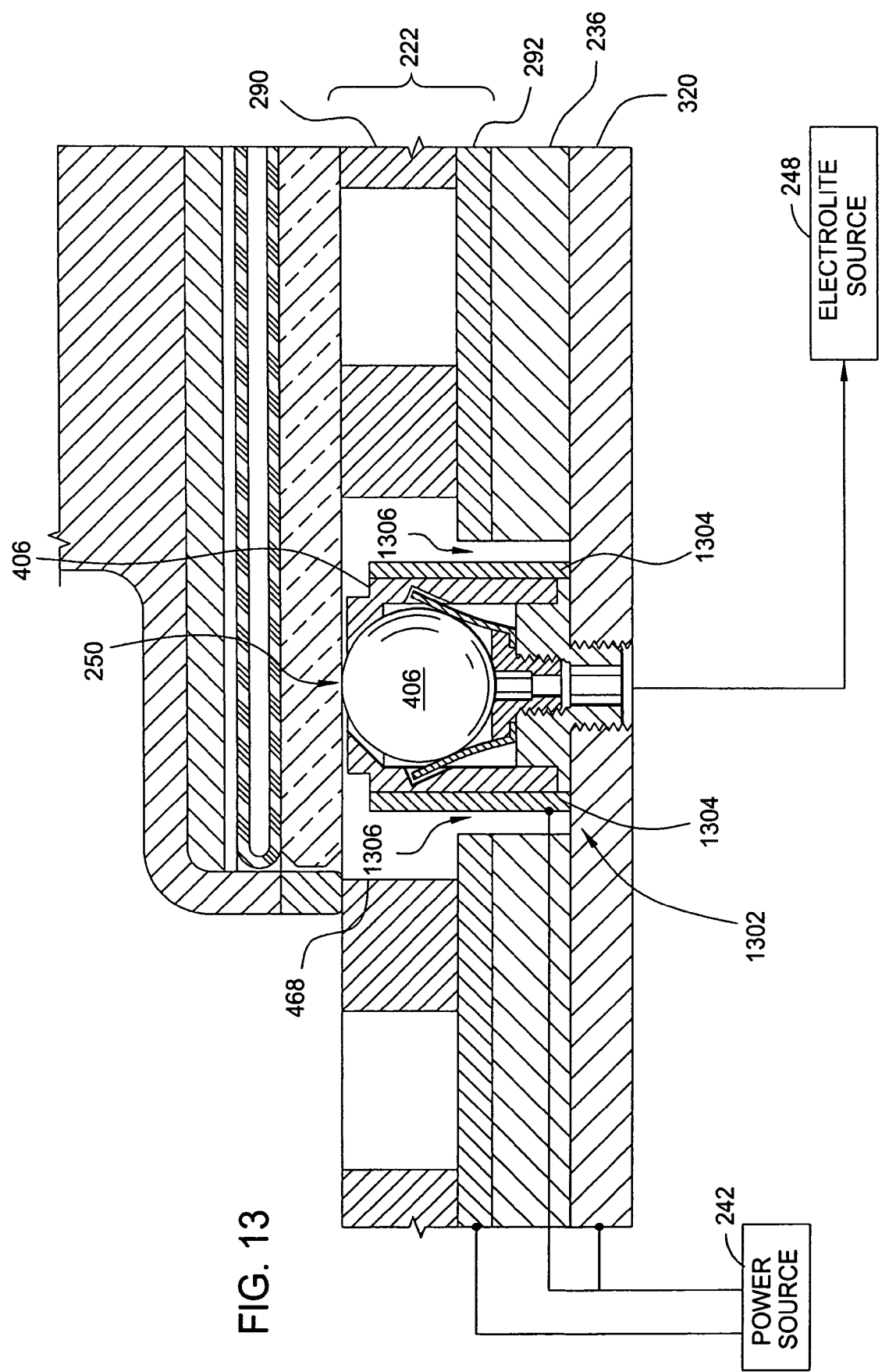
FIG. 13 is a sectional view of one embodiment of an ECMP station having a corrosion shield.

Alternatively, or additionally, as depicted in FIG. 13, electrochemical attack on the contact assembly 250 and/or balls 406 may be minimized by use of a corrosion shield 1302. The corrosion shield 1302 generally includes a conductive material 1304 that surrounds the contact assemblies 250. In one embodiment the conductive material 1304 is coupled to the power source 242. The conductive material 242 may be coupled to the power source 242 through the housing 402, the contact plate 320, or through a separate connection. Alternatively, the conductive material 1304 may be coupled to a different power source (not shown). The conductive material 1304 may comprise a non corroding material such as graphite, conducting polymers, noble metals, and the like. Alternatively, the conductive material 1304 may comprise the same material as the contact element, e.g., copper.

A gap 1306 separates the conductive material 1304 from the electrode 292. Alternatively, the gap 1306 may be filled with a dielectric compatible with process chemistries, such as PEEK. During processing, the aperture 468 is filled with an electrolyte from the electrolyte source 248. Due to the electrolyte being in contact with both the conductive material 1304 and the electrode 292, the local electrical potential difference between the electrolyte and the ball 406 is minimized, thereby reducing the electrolytic corrosion of the ball 406.

Although the corrosion shield 1302 is depicted with respect to the embodiment of the contact assembly 250 shown in FIG. 4, the corrosion shield 1302 as described herein may be adapted for use in other embodiments of the contact assembly 250 or other contact assemblies where corrosion of the contact member is desired to be minimized. In embodiments where multiple contacts are disposed in a housing, such as in the embodiment depicted in FIG. 9, the corrosion shield 1302 may be provided around each contact or, alternatively, around the housing.

In another embodiment, a rinsing fluid source 450 may be coupled through a selector valve 452 between the electrolyte source 248 and the contact assembly 250. The selector valve 452 allows a rinsing fluid, such as de-ionized water, to be flowed past the ball 406 during idle periods (when no substrates are being polished on the platen assembly 230) to prevent the ball 406 from being attacked by processing chemistries. It is contemplated that other configurations may be utilized to selectively couple the electrolyte source 248 and the rinsing fluid source 450 to the plenum 206, or that the electrolyte source 248 and the rinsing fluid source 450 may comprise a single fluid delivery system. It is also contemplated that, in a simple configuration, keeping a bleeding flow of processing chemistry around the balls all the time substantially prevents self catalytic reaction of the balls in the process chemistry (by removing the catalyst byproduct away from the ball), thus minimizing chemical attack on the balls due by eliminating the presence of static process chemistry.

Returning to FIG. 2, the platen assembly 230 may include a sonic transducer 254 coupled thereto. The transducer 254 is adapted to vibrate the platen assembly 230, thereby inducing movement and/or rotation of the ball 406 within the housing 402 (seen in FIG. 4) of the contact assembly 250. One skilled in the art will appreciate that the term "coupled" is intended include connecting, embedding, fastening, laminating, molding, bonding, adhering or otherwise positioning the transducer 254 relative to the platen assembly 230 such that the transducer 254 may induce movement of the ball 406. The transducer 254 may be activated during idle periods between substrate planarizing to induce ball motion within the contact assembly 250, thereby reducing the effects of processing chemistry on the ball 406. Alternatively, a rotating disk made from soft materials compatible with processing chemistry, such as PEEK, PPS, can cover that contact assemblies during idle period to induce the rotation of the balls, thus minimize the static chemical attack on the balls as described with reference to FIG. 12 below.

Optionally, the platen assembly 230 may include a sacrificial metal 258 disposed therein. The sacrificial metal 258 may be exposed through an aperture, depression or slot 256 form in the top surface 260 of the platen assembly 230. The sacrificial metal 258 may be positioned near or remote from the contact assemblies 250, as long as process chemistries disposed on the top surface 260 of the planarizing material 222 may contiguously wet the sacrificial metal 258 and the ball 406. The sacrificial metal 258 is additionally electrically coupled to the ball 406 (seen in FIG. 4) through the platen assembly 230. The sacrificial metal 258 is formed of a material, for example zinc, that is preferentially reactive with the process chemistries relative to the material comprising the outer surface of the ball 406, thereby minimizing the attack on the ball 406 by process chemistries. The means for protecting the ball described in herein can be utilized separately or together to protect the ball from chemical attack by the processing chemistry.

Figure 7:
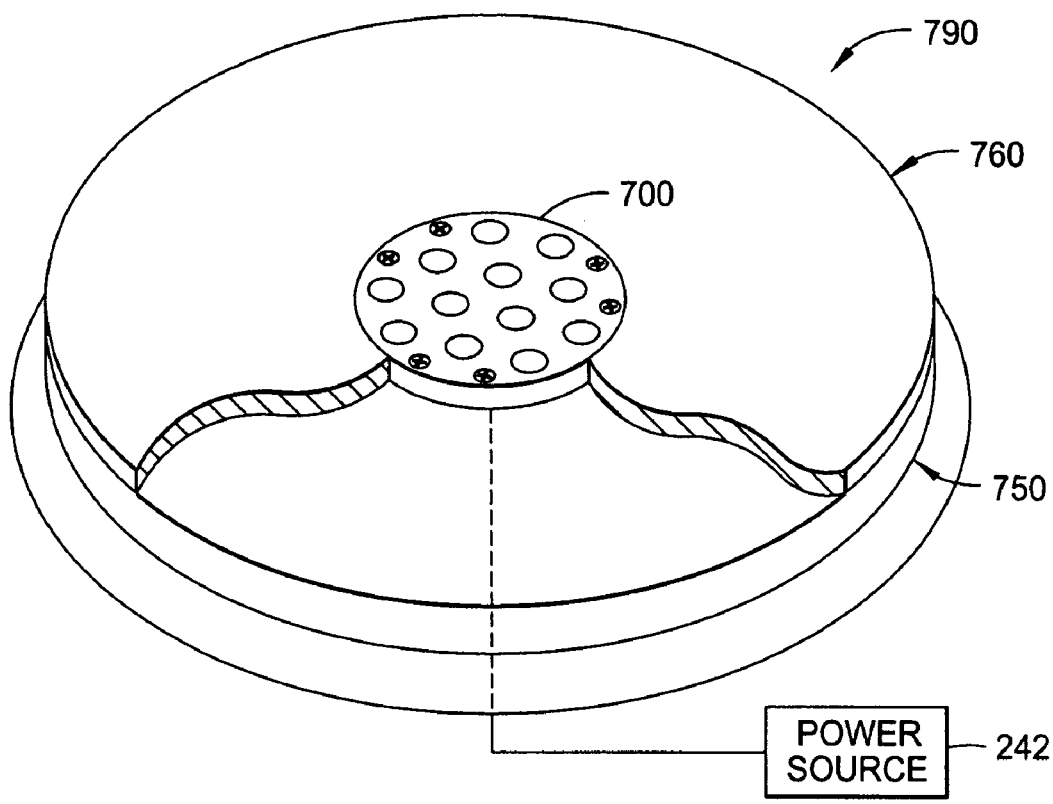
FIG. 7 is a perspective view of another embodiment of a bulk ECMP station.
Figure 8:
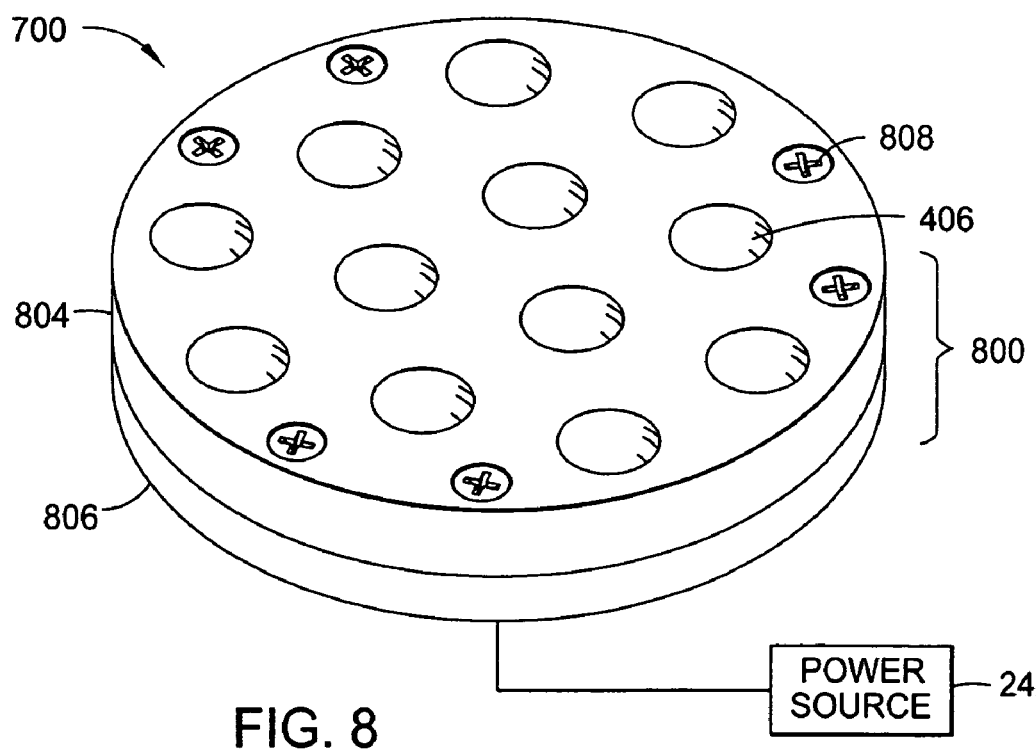
FIGS. 8-9 are perspective and partial sectional views of a contact assembly.
Figure 9:
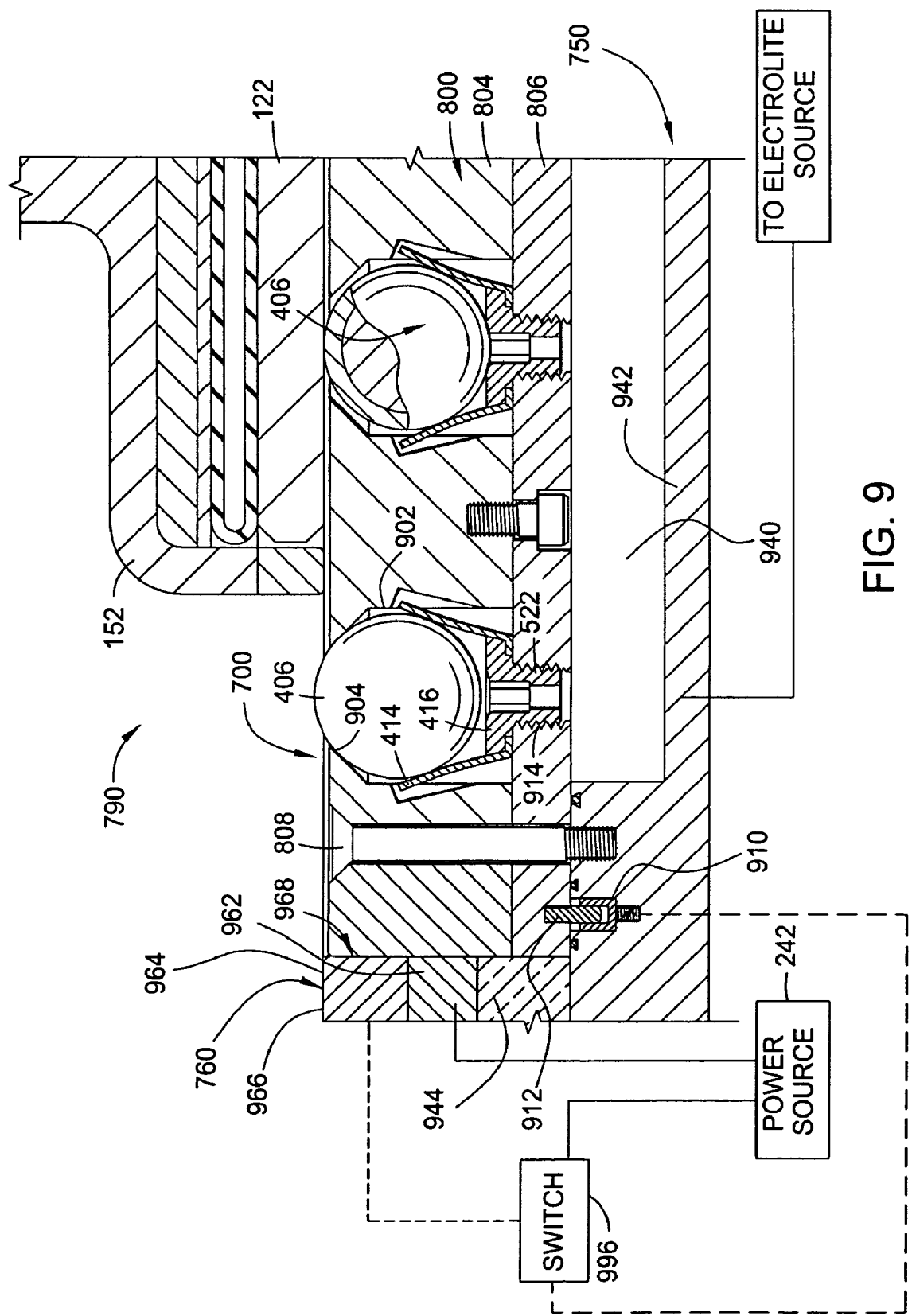

FIG. 7 is a perspective view of another embodiment of a bulk ECMP station 790 having another embodiment of a contact assembly 700 disposed therein, and FIGS. 8-9 are perspective and partial sectional views of the contact assembly 700. The ECMP station 790 includes a platen assembly 750 that supports a processing pad assembly 760 (partially shown in FIG. 7). The platen assembly 750 includes at least one contact assembly 700 projecting therefrom that is coupled to a power source 242. The contact assembly 700 is adapted to electrically bias a surface of the substrate 122 (shown in FIG. 9) during processing. Although one contact assembly 700 is shown coupled to the center of the platen assembly 750 in FIG. 7, any number of contact assemblies may be utilized and may be distributed in any number of configurations relative to the centerline of the platen assembly 750. The contact assembly 700 may also comprise a structure having a conductive upper surface suitable for biasing the substrate 122, as discussed above with respect to FIG. 4.

The processing pad assembly 760 may be any pad assembly suitable for processing the substrate, including any of the embodiments described above. The processing pad assembly 760 may include an electrode 962 and a planarizing layer 966. In one embodiment, the planarizing layer 966 of the processing pad assembly 760 may include a planarizing surface 964 that is dielectric, such as a polyurethane pad. In another embodiment, the planarizing layer 966 of the processing pad assembly 760 may include a planarizing surface 964 that is conductive or made from a conductive composite (i.e., the conduct elements are dispersed integrally with or comprise the material comprising the planarizing surface), such as a polymer matrix having conductive particles dispersed therein or a conductive coated fabric, among others. In the embodiment wherein the planarizing surface 964 is conductive, the planarizing surface 964 and electrode 962 may be coupled to the power source 242 (shown by the dashed lines) via a switch 996 that allows power to be selectively switched between the contact assembly 700 and the conductive planarizing surface 964 to respectively facilitate bulk metal removal and residual metal removal from the substrate 122 without lifting the substrate 122 from the processing pad assembly 760. It is contemplated that the bulk ECMP station 128 may also be similarly configured with a conductive processing pad assembly.

The contact assembly 700 is generally coupled to a conductive contact terminal 910 disposed in the platen assembly 750 and extends at least partially through an aperture 968 formed in the processing pad assembly 760. The contact assembly 700 includes a housing 802 that retains a plurality of balls 406. The balls 406 are movably disposed in the housing 802, and may be disposed in a first position having at least a portion of the balls 406 extending above the planarizing surface 964 and at least a second position where the balls 406 are flush with the planarizing surface 964. The balls 406 are generally suitable for electrically biasing the substrate 122.

The housing 802 is removably coupled to the platen assembly 750 to facilitate replacement of the contact assembly 700 after a number of planarizing cycles. In one embodiment, the housing 802 is coupled to the platen assembly 750 by a plurality of screws 808. The housing 802 includes an upper housing 804 coupled to a lower housing 806 that retains the balls 406 therebetween. The upper housing 804 is fabricated from a dielectric material compatible with process chemistries. In one embodiment, the upper housing 804 is made of PEEK. The lower housing 806 is fabricated from a conductive material compatible with process chemistries. In one embodiment, the lower housing 806 is made of stainless steel or other electrically conductive material. The lower housing 806 is coupled to by a bayonet fitting 912 to the contact terminal 910 which is in turn coupled to the power source 242. The housings 804, 806 may be coupled in any number of methods, including but not limited to, screwing, bolting, riveting, bonding, staking and clamping, among others. In the embodiment depicted in FIGS. 7-9, the housings 804, 806 are coupled by a plurality of screws 908.

The balls 406 are disposed in a plurality of apertures 902 formed through the housings 804, 806. An upper portion of each of the apertures 902 includes a seat 904 that extends into the aperture 902 from the upper housing 804. The seat 904 is configured to prevent the ball 406 from exiting the top end of the aperture 902.

A contact element 414 is disposed in each aperture 902 to electrically couple the ball 406 to the lower plate 806. Each of the contact elements 414 is coupled to the lower plate 806 by a respective clamp bushing 416. In one embodiment, a post 522 of the clamp bushing 416 is threaded into a threaded portion 914 of the aperture 902 formed through the housing 802.

During processing, the balls 406 disposed within the housing 802 are actuated toward the planarizing surface 760 by at least one of spring, buoyant or flow forces. The balls 406 electrically couple the substrate 122 to the power source 242 and contact terminal 910 through the contact elements 414 and lower plate 806. Electrolyte, flowing through the housing 802 provides a conductive path between the electrode 962 and biased substrate 122, thereby driving an electrochemical mechanical planarizing process.

In the embodiment depicted in FIG. 9, a plenum 940 may be formed in a lower plate 942 of the platen assembly 750. An electrolyte source 248 is coupled to the plenum 940 and flows electrolyte to the planarizing surface 760 through the apertures 902 of the contact assembly 700. In this configuration, a top plate 944 may optionally be a unitary component with the lower plate 942. The plenum 940 may alternatively be disposed in the top plate 944 as described above.

Figure 10:
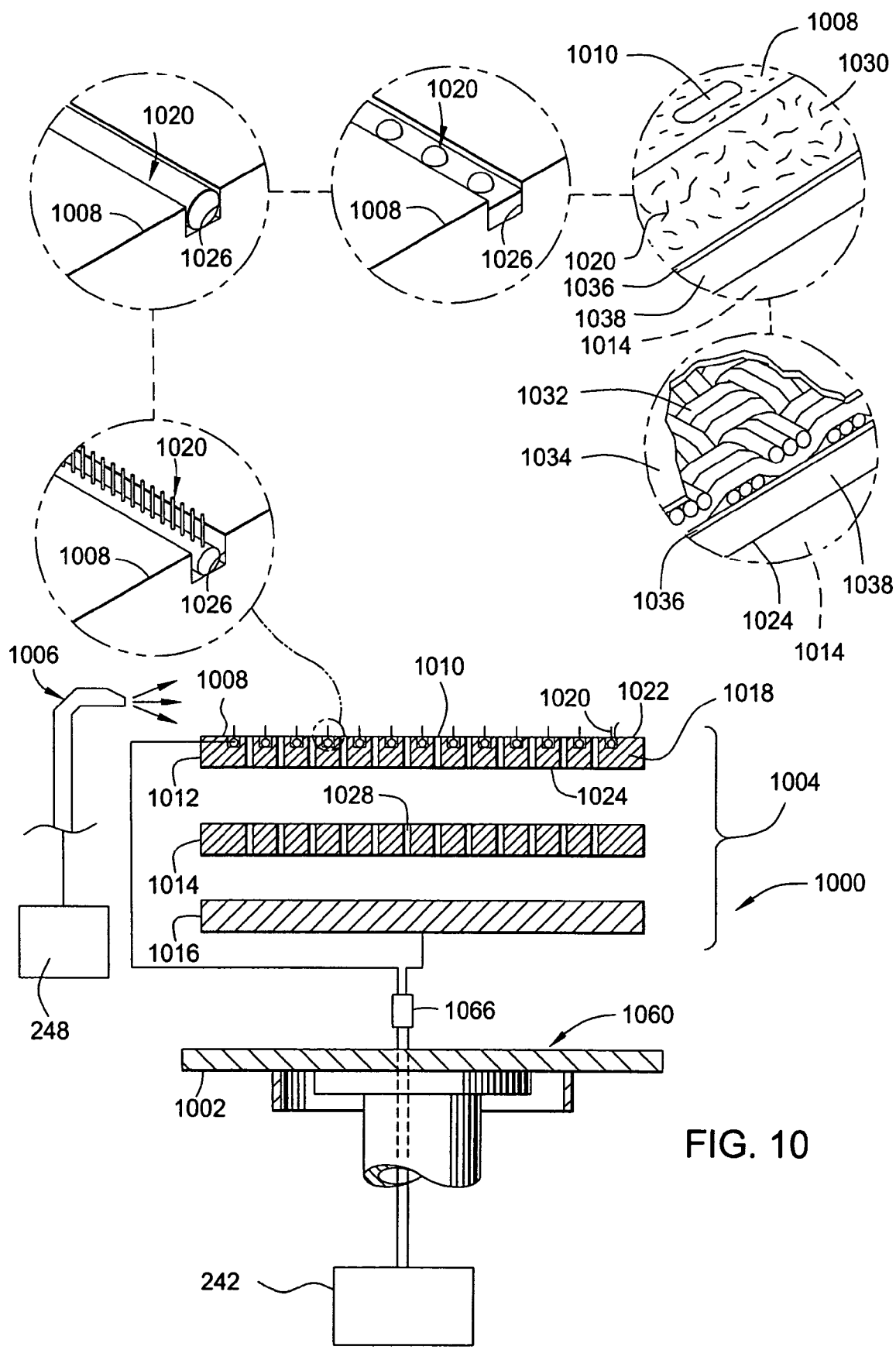
FIG. 10 is an exploded simplified sectional view of another embodiment of a bulk ECMP station.

FIG. 10 is an exploded simplified sectional view of another embodiment of a bulk ECMP station 1000. The bulk ECMP station 1000 includes a platen assembly 1002 that supports a processing pad assembly 1004 on which the substrate (not shown) is processed. Electrolyte may be delivered to the upper surface of the planarizing material 1004 from an electrolyte source 248 through the platen assembly 1002 or by a nozzle 1006 positioned adjacent the upper surface of the processing pad assembly 1004.

The pad assembly 1004 depicted in FIG. 10 is coupled to the power source 242 and includes a conductive pad 1012 sandwiching a subpad 1014 to an electrode 1016. Typically, the conductive pad 1012, the subpad 1014 and the electrode 1016 are secured together forming a unitary body that facilitates removal and replacement of the pad assembly 1004 from the platen assembly 1002. Alternatively, the conductive pad 1012, the subpad 1014 and the electrode 1016 may be coupled by other methods or combinations thereof, including sewing, binding, heat staking, riveting, screwing and clamping among others.

The conductive pad 1012 includes a pad body 1018 and one or more conductive elements 1020. The conductive elements 1020 are coupled to the power source 242 and are adapted to extend from, be coplanar or be exposed on an upper surface 1008 of the pad body 1018 that faces toward the planarizing head 204 to contact the surface of the substrate 122 (as seen in FIG. 2).

The pad body 1018 may be fabricated from polymeric materials compatible with process chemistry, examples of which include polyurethane, polycarbonate, fluoropolymers, PTFE, PTFA, polyphenylene sulfide (PPS), or combinations thereof, and other planarizing materials used in planarizing substrate surfaces. The pad material may be coated with one or more layers of conductive material(s). The pad body 1018 may be a polymer binder having the conductive elements 1020 suspended and dispersed therein. Exemplary material includes those made from polyurethane and/or polyurethane mixed with fillers, which are commercially available from Rodel, Inc., located in Newark, Del. Other conventional planarizing materials, such as a layer of compressible material, may also be utilized for the pad body 1018. Compressible materials include, but are not limited to, soft materials such as compressed felt fibers leached with urethane or foam. The pad body 1018 is generally between about 10 to about 100 mils thick.

The pad body 1018 has a first side 1022 and a second side 1024. The first side 1022 is adapted to contact the substrate 122 during processing and may include grooves, embossing or other texturing to promote planarizing performance. The pad body 1018 may be solid, impermeable to electrolyte, permeable to electrolyte or perforated. The first side 1022 may optionally include one or more slots 1026 or other feature that retains the conductive elements 1020. In the embodiment depicted in FIG. 10, the pad body 1018 is perforated with a plurality of apertures 1010 adapted to allow flow of electrolyte therethrough.

The conductive elements 1020 may include conductive polymers, polymer composites with conductive materials, conductive metals or polymers, conductive fillers, graphitic materials, or conductive doping materials, or combinations thereof. The conductive elements 1020 generally have a bulk resistivity or a bulk surface resistivity of about 10 Ω-cm or less. The conductive elements 1020 may be a plurality of electrically conductive fibers, stands and/or flexible fingers, such as carbon fibers or other conductive, compliant (i.e., flexible) material that contact the substrate while processing. Alternatively, the conductive elements 1020 may be rollers, balls, rods, bars, mesh or other shape that facilitates conductive contact between the substrate disposed on the conductive pad 1012 and the power source 242.

In embodiments where the conductive elements 1020 are conductive fillers, particles or other materials disposed in a polymer binder 1030, or where the conductive elements 1020 are a fabric 1032 having conductive coating (optionally having a conductive foil 1034 disposed thereon), the pad body 1018 may have a conductive backing 1036 to ensure uniform distribution of the voltage applied by the source 242 across the width of the processing pad assembly 1004. Optionally, such embodiments may also include an interposed layer 1038 disposed between the conductive backing 1036 and the subpad 1014. The interposed layer 1038 is generally harder than the subpad 1014 and provides mechanical support to the pad body 1018. Examples of conductive pads that may be adapted to benefit from the invention are described in U.S. patent application Ser. No. 10/140,010, filed May 7, 2002, and U.S. patent application Ser. No. 10/211,262, filed Aug. 2, 2002, both of which are incorporated herein by reference in their entireties.

The subpad 1014 is coupled to the second side 1022 of the pad body 1018. The subpad 1014 is typically fabricated from a material softer, or more compliant, than the material of the pad body 1018. The difference in hardness or durometer between the pad body 1018 and the subpad 1014 may be chosen to produce a desired planarizing/plating performance. The subpad 1014 may also be compressive. Examples of suitable backing materials include, but are not limited to, foamed polymer, elastomers, felt, impregnated felt and plastics compatible with the planarizing chemistries.

The subpad 1014 may be solid, impermeable to electrolyte, permeable to electrolyte or perforated. In one embodiment depicted in FIG. 3, the subpad 1014 is configured to allow electrolyte therethrough, and may be permeable, have holes formed therethrough or a combination thereof. In the embodiment depicted in FIG. 3, the subpad 1014 is perforated with a plurality of apertures 1028 adapted to allow flow of electrolyte therethrough. The apertures 1028 of the subpad 1014 typically, but not necessarily, align with the apertures 1010 of the pad body 1018.

The electrode 1016 is typically comprised of a corrosion resistant conductive material, such as metals, conductive alloys, metal coated fabrics, conductive polymers, conductive pads, and the like. Conductive metals include Sn, Ni, Cu, Au, and the like. Conductive metals also include a corrosion resistant metal such as Sn, Ni, or Au coated over an active metal such as Cu, Zn, Al, and the like. Conductive alloys include inorganic alloys and metal alloys such as bronze, brass, stainless steel, or palladium-tin alloys, among others. Metal coated fabric may be woven or non-woven with any corrosion resistant metal coating. Conductive pads consist of conductive fillers disposed in a polymer matrix. The electrode 1016 should also be fabricated of a material compatible with electrolyte chemistries to minimize cross-talk between zones when multi-zoned electrodes are utilized. For example, metals stable in the electrolyte chemistries are able to minimize zone cross-talk.

When metal is used as material for the electrode 1016, it may be a solid sheet. Alternatively, the electrode 1016 may be formed of a metal screen or may be perforated in order to increase the adhesion to adjoining layers. The electrode 1016 may also be primed with an adhesion promoter to increase the adhesion to the adjoining layers. An electrode 1016 which is perforated or formed of a metal screen also has a greater surface area, which further increases the substrate removal rate during processing.

When the electrode 1016 is fabricated from metal screen, a perforated metal sheet, or conductive fabric, one side of the electrode 1016 may be laminated, coated, or molded with a polymer layer which penetrates the openings in the electrode 1016 to further increase adhesion to the adjoining layers. When the electrode 1016 is formed from a conductive pad, the polymer matrix of the conductive pad may have a high affinity or interaction to an adhesive applied to the adjoining layers.

In one embodiment, the electrode 1016 is coupled to the side of the subpad 1014 opposite the pad body 1018. The electrode 1016 may be solid, impermeable to electrolyte, permeable to electrolyte or perforated. In the embodiment depicted in FIG. 3, the electrode 1016 is configured to allow electrolyte therethrough. The electrode 1016 may be permeable, have holes formed therethrough or a combination thereof. The electrode 1016 is disposed on an upper surface 1060 of the platen assembly 1002 and is coupled to the power source 242. The leads coupling the electrode 1016 and conductive elements 1020 may be coupled to the power source 242 using one or more disconnects 1066 to further facilitate removal and replacement of the planarizing material 1004. It is also contemplated that the electrode 1016, and other electrodes described herein, may comprise a plurality of independently biasable electrode segments, for example, concentric electrodes, electrode arc segments, and the like. It is also contemplated that the interface between the electrode segments may have an interlocking, or non-linear configuration.

A portion of an exemplary mode of operation of the processing system 100 is described primarily with reference to FIG. 2. In operation, the substrate 122 is retained in the planarizing head 204 and moved over the processing pad assembly 222 disposed on the platen assembly 230 of the bulk ECMP station 1128. The planarizing head 204 is lowered toward the platen assembly 230 to place the substrate 122 in contact with the planarizing material. Electrolyte is supplied to the processing pad assembly 222 through the outlet 274 and flows into the processing pad assembly 222.

A bias voltage is applied from the power source 242 between the conductive elements 362 of the conductive pad 1012 and the electrode 1016 of the pad assembly 222. The conductive elements 362 are in contact with the substrate and apply a bias thereto. The electrolyte filling the apertures 304, 306 between the electrode 1016 and the substrate 122 provides a conductive path between the power source 242 and substrate 122 to drive an electrochemical mechanical planarizing process that results in the removal of conductive material, such as copper, disposed on the surface of the substrate 122, by an anodic dissolution method.

Once the substrate 122 has been adequately planarized by removal of conductive material at the bulk ECMP station 128, the planarizing head 204 is raised to remove the substrate 122 from contact with the platen assembly 230 and the processing pad assembly 222. The substrate 122 may be transferred to one of another bulk ECMP station, the residual ECMP station 130 or the CMP station 132 for further processing before removal from the planarizing module 106.

Figure 11:
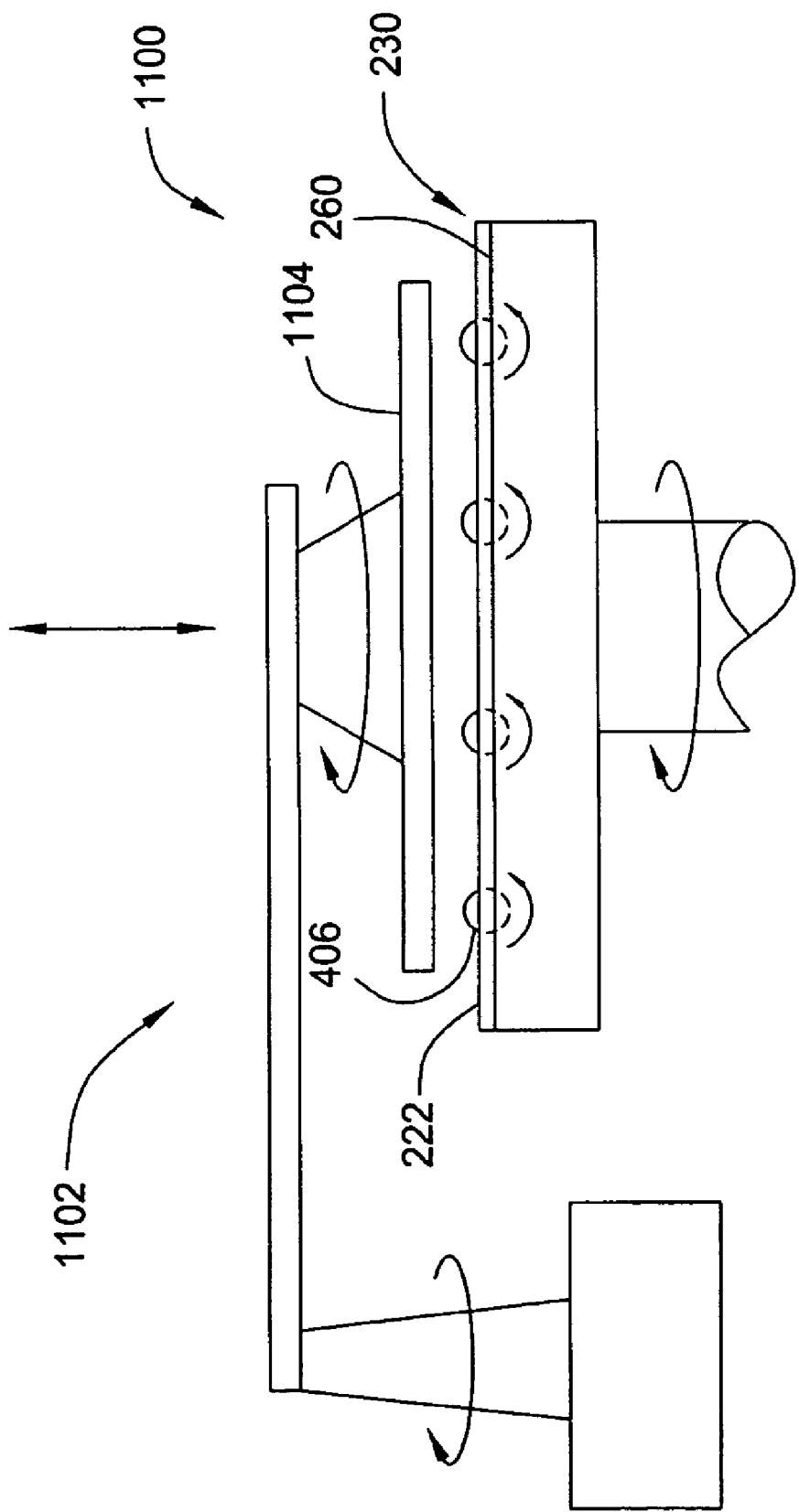
FIG. 11 is a simplified sectional side view of another embodiment of a bulk ECMP station having a ball conditioning device.

FIG. 11 a simplified sectional side view of one embodiment of a bulk ECMP station 1100 having a ball conditioning device 1102. The ball conditioning device 1102 is disposed adjacent a platen assembly 230 and may be rotated between a first position clear of the platen assembly 230 and second position over the platen assembly 230 as shown in FIG. 11.

The ball conditioning device 1102 includes a pad 1104 having an orientation generally parallel to the top surface 260 of the platen assembly 230. The pad 1104 is adapted to contact one or more balls 406 extending above the top surface 260 during process idle time between substrate planarizing while maintaining a spaced-apart relation relative to the processing pad assembly 222 disposed on the platen assembly 230. Relative motion between the ball conditioning device 1102 and the one or more balls 406 in contact therewith, causes the balls 406 to rotate, thereby reducing the attack on the ball 406 by process chemistries. Relative motion between the ball conditioning device 1102 and the one or more balls 406 may be provided by sweeping the conditioning device 1102, rotating the platen assembly 230, rotating the pad 1104, combinations thereof, or other motion suitable to induce rotation of the ball 406.

In one embodiment, the pad 1104 may be fabricated from a polymeric material. Alternatively, the pad 1104 may be fabricated from a conductive material, such as a metal, conductive polymer or polymer having conductive material disposed therein. In the embodiment wherein the pad 1104 is conductive, the pad 1104 may be negatively biased to further protect the ball 406 from process chemistries. It is contemplated that the other methodologies described above for protecting the balls 406 from process chemistries may be utilized in conjunction with the conditioning device 1102, or in any other combination thereof.

Figure 12:
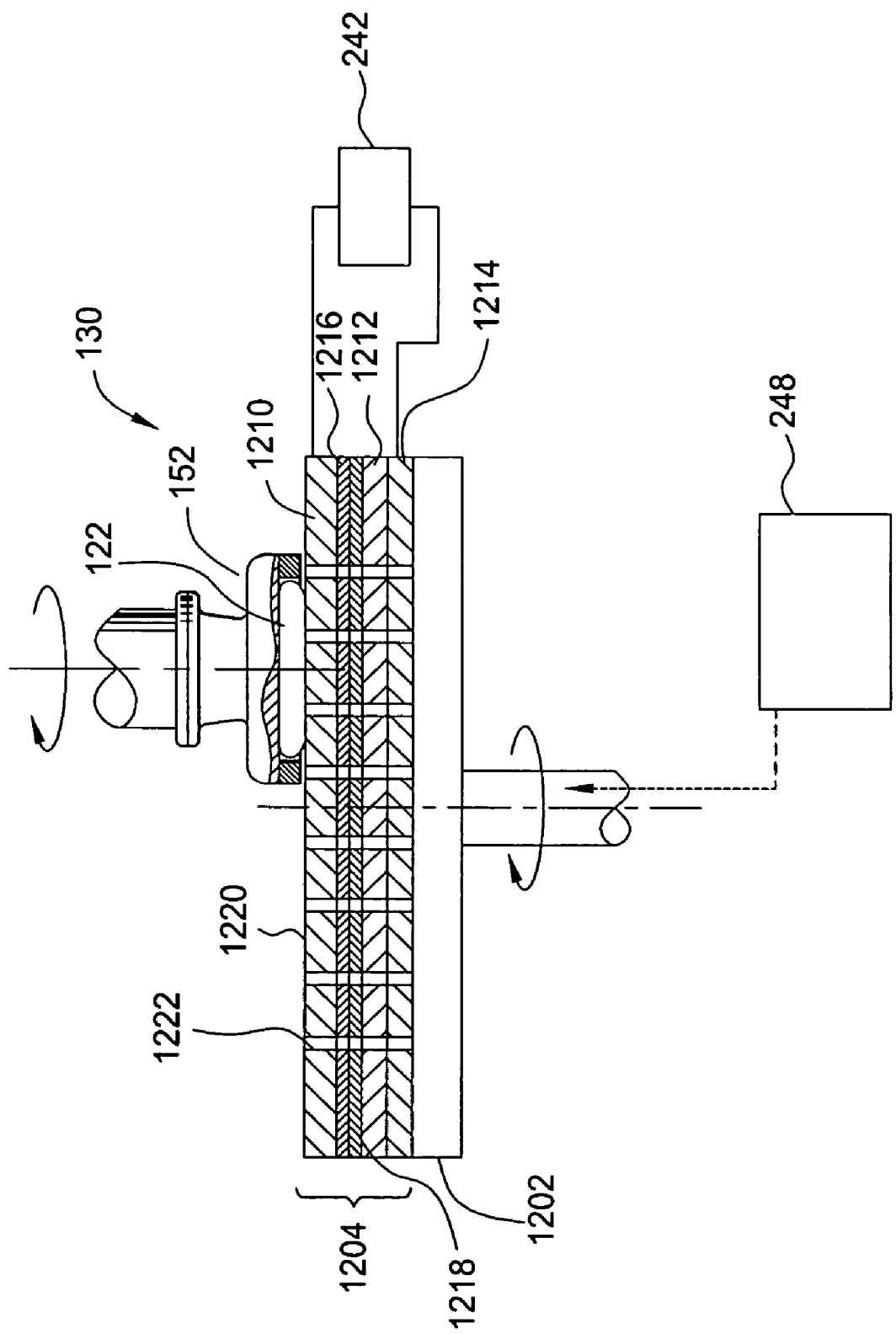
FIG. 12 is a sectional view of one embodiment of a residual ECMP station.

FIG. 12 is a sectional view of one embodiment of the residual ECMP station 130. The second ECMP station 130 generally includes a platen 1202 that supports a fully conductive processing pad assembly 1204. The platen 1202 may be configured similar to the platen assembly 230 described above to deliver electrolyte through the processing pad assembly 1204, or the platen 1202 may have a fluid delivery arm 1206 disposed adjacent thereto configured to supply electrolyte to a planarizing surface of the processing pad assembly 1204.

In one embodiment, the processing pad assembly 1204 includes interposed pad 1212 sandwiched between a conductive pad 1210 and an electrode 1214. The conductive pad 1210 is substantially conductive across its top processing surface and is generally made from a conductive material or a conductive composite (i.e., the conductive elements are dispersed integrally with or comprise the material comprising the planarizing surface), such as a polymer matrix having conductive particles dispersed therein or a conductive coated fabric, among others. The conductive pad 1210, the interposed pad 1212, and the electrode 1214 may be fabricated like the conductive pads 966, 1012, the backing 1014, and the electrode 1016 described above. The processing pad assembly 1204 is generally permeable or perforated to allow electrolyte to pass between the electrode 1214 and top surface 1220 of the conductive pad 1210. In the embodiment depicted in FIG. 12, the processing pad assembly 1204 is perforated by apertures 1222 to allow electrolyte to flow therethrough. In one embodiment, the conductive pad 1210 is comprised of a conductive material disposed on a polymer matrix disposed on a conductive fiber, for example, tin particles in a polymer matrix disposed on a woven copper coated polymer. The conductive pad 1210 may also be utilized for the contact assembly 700 in the embodiment of FIG. 7.

A conductive foil 1216 may additionally be disposed between the conductive pad 1210 and the subpad 1212. The foil 1216 is coupled to a power source 242 and provides uniform distribution of voltage applied by the source 242 across the conductive pad 1210. Additionally, the pad assembly 1204 may include an interposed pad 1218, which, along with the foil 1216, provides mechanical strength to the overlying conductive pad 1210. The foil 1216 and interposed pad 1218 may be configured similar to the interposed layer 1038 and conductive backing 1036 described above.

Another portion of an exemplary mode of operation of the processing system 100 is described primarily with reference to FIG. 12. In operation, the substrate 122 retained in the planarizing head 204 is moved over the processing pad assembly 1204 disposed on the platen assembly 1202 of the residual ECMP station 130. The planarizing head 204 is lowered toward the platen assembly 1202 to place the substrate 122 in contact with the top surface 1220 of the conductive pad 1210. Electrolyte is supplied to the processing pad assembly 1210 through the delivery arm 1206 and flows into the processing pad assembly 1204.

A bias voltage is applied from the power source 242 between the top surface 1220 of the conductive pad 1210 and the electrode 1214 of the pad assembly 1204. The top surface 1220 of the conductive pad 1210 is in contact with the substrate and applies an electrical bias thereto. The electrolyte filling the apertures 1222 between the electrode 1214 and the substrate 122 provides a conductive path between the power source 242 and substrate 122 to drive an electrochemical mechanical planarizing process that results in the removal of conductive material, such as copper, disposed on the surface of the substrate 122, by an anodic dissolution method. As the top surface 1220 of the conductive pad 1210 is fully conductive, residual material, such as discrete islands of copper not completely removed through processing at the bulk ECMP station 128, may be efficiently removed.

Once the substrate 122 has been adequately planarized by removal of residual conductive material at the residual ECMP station 130, the planarizing head 204 is raised to remove the substrate 122 from contact with the platen assembly 1202 and the processing pad assembly 1204. The substrate 122 may be transferred to another residual ECMP station or one of the CMP station 132 for further processing before removal from the planarizing module 106.

Thus, the present invention provides an improved apparatus and method for electrochemically planarizing a substrate. The apparatus advantageously facilitates efficient bulk and residual material removal from a substrate while protecting process components from damage during idle periods between processing. It is also contemplated that an apparatus arranged as described by the teachings herein, may be configured with solely the bulk ECMP stations 128, with solely the residual ECMP stations 130, with one or more bulk and/or residual ECMP stations 130 arranged in cooperation with a conventional CMP station 132, or in any combination thereof. It is also contemplated that a method and apparatus as described by the teachings herein, may be utilized to deposit materials onto a substrate by reversing the polarity of the bias applied to the electrode and the substrate.

While the foregoing is directed to embodiments of the invention, other and further embodiments of the invention may be devised without departing from the basic scope thereof, and the scope thereof is determined by the claims that follow.

What is claimed is:

1. A cell for processing a substrate, comprising:
   a platen assembly having a support surface;
   an electrode disposed on the platen assembly;
   a plenum defined within the platen assembly; and
   a plurality of passages formed through the platen assembly coupling the support surface to the plenum.

2. The cell of claim 1, further comprising:
   a processing pad disposed on the platen assembly and having an upper dielectric processing surface adapted to process a substrate thereon; and
   one or more conductive elements arranged on the upper processing surface to electrically bias the substrate.

3. The cell of claim 2, wherein the platen assembly further comprises:
   a top plate that includes a top surface and having at least a first portion of each of the passages formed therethrough; and
   a conductive contact plate disposed opposite a surface of the top plate having the processing pad disposed thereon and electrically coupled to the conductive elements, the conductive contact plate having at least a second portion of each of the passages formed therethrough.

4. The cell of claim 3, wherein the conductive plate is disposed in the plenum formed in the platen assembly.

5. The cell of claim 4, wherein at least one of the one or more conductive elements comprises:
   a ball; and
   an adapter electrically coupled between the ball and the conductive contact plate.

6. The cell of claim 5, wherein the ball is fabricated from a polymer coated with a conductive outer layer.

7. The cell of claim 5, wherein the ball is fabricated from at least one of a conductive composite, a metal, a conductive polymer, or a polymeric material filled with conductive material.

8. The cell of claim 5, wherein the ball further comprises:
   at least one of a noble metal or copper outer surface; and
   core that is hollow or a material other than copper.

9. The cell of claim 5, wherein at least one of the one or more conductive elements comprises:
   a housing having a passage formed therethrough;
   a seat extending into the passage from an end of the housing proximate the processing surface, the seat retaining the ball at least partially within the housing; and
   at least one groove formed in the seat allowing fluid bypass between the ball and housing when the ball is in contact with the seat.

10. The cell of claim 5, further comprising:
    a housing retaining the ball; and
    a conductive shield coupled to an outer surface of the housing.

11. The cell of claim 10, wherein the conductive shield comprises at least one of graphite, conductive polymers, noble metals, or copper.

12. The cell of claim 4, wherein the one or more conductive elements further comprise:
    a plurality of balls adapted to bias the substrate disposed on the processing surface during processing; and
    a housing retaining the balls.

13. The cell of claim 12 further comprising:
    an electrolyte source adapted to flow processing fluid to the processing surface through the housing; and
    a rinsing source adapted to flow a rinsing fluid to the processing surface through the housing.

14. The cell of claim 12, further comprising:
    a conductive shield coupled to an outer surface of the housing.

15. The cell of claim 14, wherein the conductive shield comprises at least one of graphite, conductive polymers, noble metals, or copper.

16. The cell of claim 3, wherein the platen assembly comprises:
    a lower plate coupled to the upper plate opposite the top surface;
    a first electrical terminal disposed in the lower plate; and a second electrical terminal disposed in the contact plate and coupled to the conductive elements, the first and second electrical terminals coupled in a male/female configuration.

17. The cell of claim 16, wherein the platen assembly further comprises:
a seal fluidly isolating the second electrical contact from the plenum.

18. The cell of claim 17, wherein the platen assembly further comprises:
a cover plate bounding the plenum opposite the contact plate;
a first fluid port disposed in the cover plate;
a second fluid port disposed in the lower plate and mating with the first fluid port; and
an electrolyte source coupled to the second fluid port.

19. The cell of claim 1, wherein the platen assembly comprises:
a sonic transducer connected to the platen assembly.

20. The cell of claim 2, wherein platen assembly further comprises:
a sacrificial metal electrically coupled to at least one of the one or more conductive elements.

21. The cell of claim 20, wherein the sacrificial metal is exposed through the processing surface.

22. The cell of claim 2, wherein the platen assembly further comprises:
a magnetic element disposed in the platen assembly and adapted to attract the processing pad towards the platen assembly.

23. The cell of claim 22, wherein the magnetic element further comprises:
a permanent magnet.

24. The cell of claim 22, wherein the magnetic element further comprises:
an electromagnet.

25. The cell of claim 2, further comprising:
a conductive element conditioner positionable in a conditioning position that contacts the conductive elements while remaining spaced-apart from the processing pad.

26. The cell of claim 2, wherein the one or more conductive elements further comprise:
a conductive upper layer comprising at least one of a conductive material, a conductive element disposed in a polymer matrix, or a conductive coated fabric.

* * * * *